(12) United States Patent
Miyahara et al.

(10) Patent No.: US 12,446,377 B2
(45) Date of Patent: Oct. 14, 2025

(54) SEMICONDUCTOR DEVICE

(71) Applicant: Sony Group Corporation, Tokyo (JP)

(72) Inventors: Hiroyuki Miyahara, Tokyo (JP);
Hisayoshi Motobayashi, Tokyo (JP);
Yoshiro Takiguchi, Tokyo (JP);
Takahiro Koyama, Tokyo (JP);
Hidekazu Kawanishi, Toyko (JP)

(73) Assignee: Sony Group Corporation, Tokyo (JP)

( * ) Notice: Subject to any disclaimer, the term of this patent is extended or adjusted under 35 U.S.C. 154(b) by 614 days.

(21) Appl. No.: 17/770,700

(22) PCT Filed: Oct. 8, 2020

(86) PCT No.: PCT/JP2020/038208
§ 371 (c)(1),
(2) Date: Apr. 21, 2022

(87) PCT Pub. No.: WO2021/085071
PCT Pub. Date: May 6, 2021

(65) Prior Publication Data
US 2022/0376156 A1   Nov. 24, 2022

(30) Foreign Application Priority Data

Oct. 28, 2019 (JP) ................. 2019-195148

(51) Int. Cl.
| | | |
|---|---|---|
| H01L 33/62 | (2010.01) | |
| H10H 20/85 | (2025.01) | |
| H10H 20/857 | (2025.01) | |

(52) U.S. Cl.
CPC ...... H10H 20/857 (2025.01); H10H 20/8506 (2025.01)

(58) Field of Classification Search
CPC ....... H01L 33/62; H01L 33/486; H01L 33/60; H01L 2933/0066; H01S 5/022;
(Continued)

(56) References Cited

U.S. PATENT DOCUMENTS

| | | | |
|---|---|---|---|
| 8,698,264 B2 | 4/2014 | Hirano et al. | |
| 12,064,827 B1 * | 8/2024 | D'Angelo | ............ B23K 1/0008 |

(Continued)

FOREIGN PATENT DOCUMENTS

| | | | |
|---|---|---|---|
| JP | H05206313 A | * | 8/1993 |
| JP | 2004-087684 A | | 3/2004 |

(Continued)

OTHER PUBLICATIONS

International Search Report issued in International Patent Application No. PCT/JP2020/038208 on Dec. 8, 2020 and English translation of same. 5 pages.

(Continued)

*Primary Examiner* — Jarrett J Stark
(74) *Attorney, Agent, or Firm* — K&L Gates LLP

(57) ABSTRACT

A first semiconductor device according to an embodiment of the present disclosure includes: a semiconductor element; a first housing member and a second housing member that house the semiconductor element; a first base layer formed on a bonded surface of the first housing member to the second housing member; a second base layer formed on a bonded surface of the second housing member to the first housing member; a solder bonding section that bonds the first housing member and the second housing member with the first base layer and the second base layer interposed in between; and a solder adsorption layer provided on at least one of the bonded surface of the first housing member or the bonded surface of the second housing member to be apart from the first base layer and the second base layer.

16 Claims, 25 Drawing Sheets

(58) Field of Classification Search
CPC ............. H10H 20/857; H10H 20/8506; H10H 20/0364; H10H 20/856
See application file for complete search history.

(56) References Cited

U.S. PATENT DOCUMENTS

| | | | | |
|---|---|---|---|---|
| 2016/0376146 A1* | 12/2016 | Diep | ................... | B81B 7/0058 |
| | | | | 257/434 |
| 2020/0093008 A1* | 3/2020 | Wang | ...................... | H01L 24/29 |
| 2020/0381592 A1* | 12/2020 | Itakura | .............. | H01L 23/49827 |

FOREIGN PATENT DOCUMENTS

| | | | | |
|---|---|---|---|---|
| JP | 2011-253951 A | 12/2011 | | |
| JP | 2012-160526 A | 8/2012 | | |
| JP | 6456290 B2 * | 1/2019 | ............. | C03C 27/06 |
| WO | WO 2019/163987 A1 | 8/2019 | | |

OTHER PUBLICATIONS

Written Opinion issued in International Patent Application No. PCT/JP2020/038208 on Dec. 8, 2020. 4 pages.

* cited by examiner

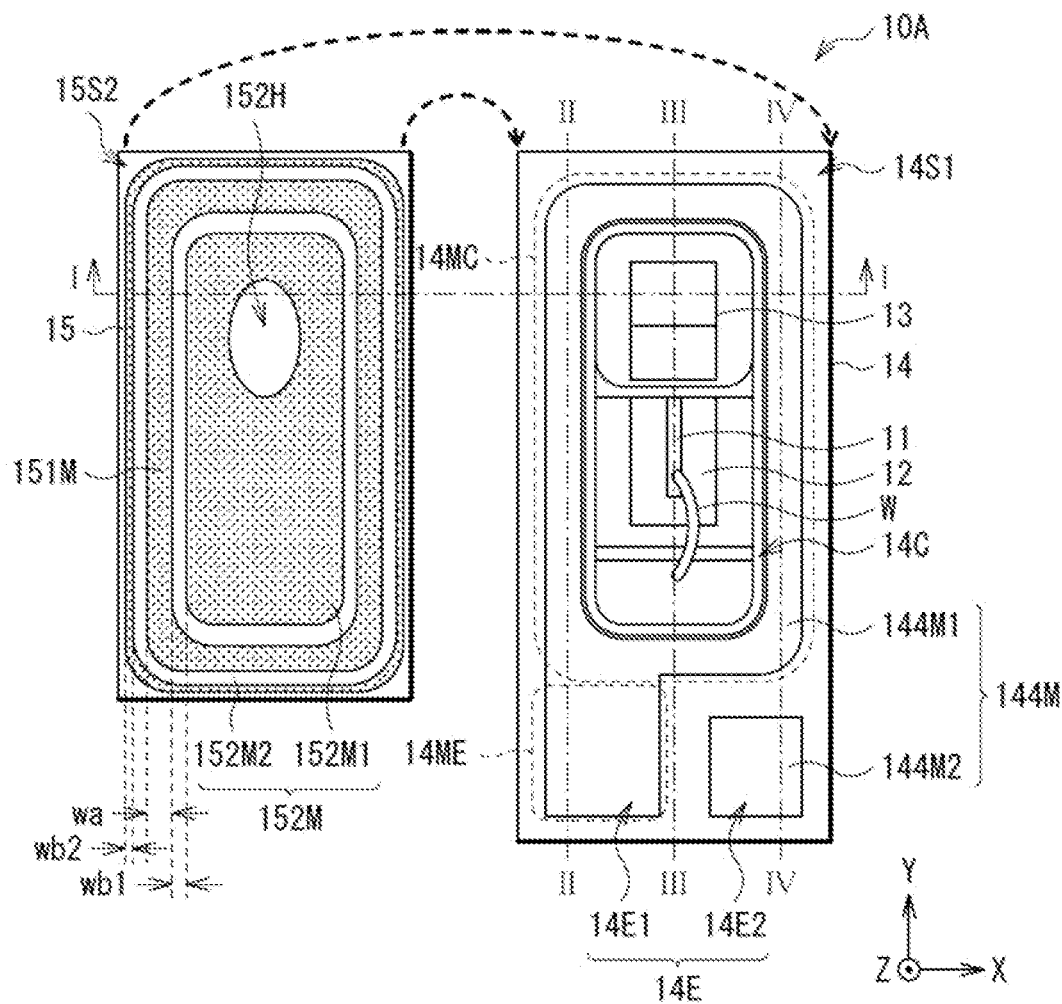
[FIG. 1A]
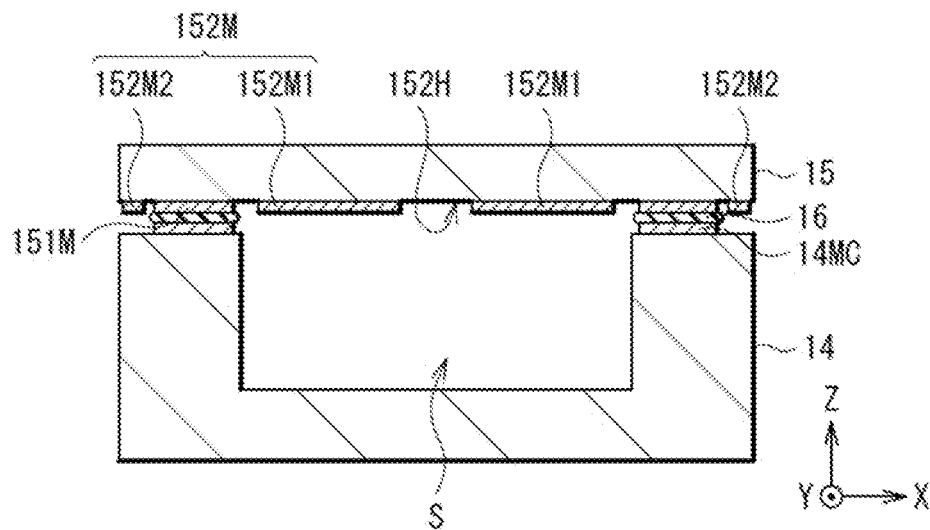
[FIG. 1B]

[FIG. 2]
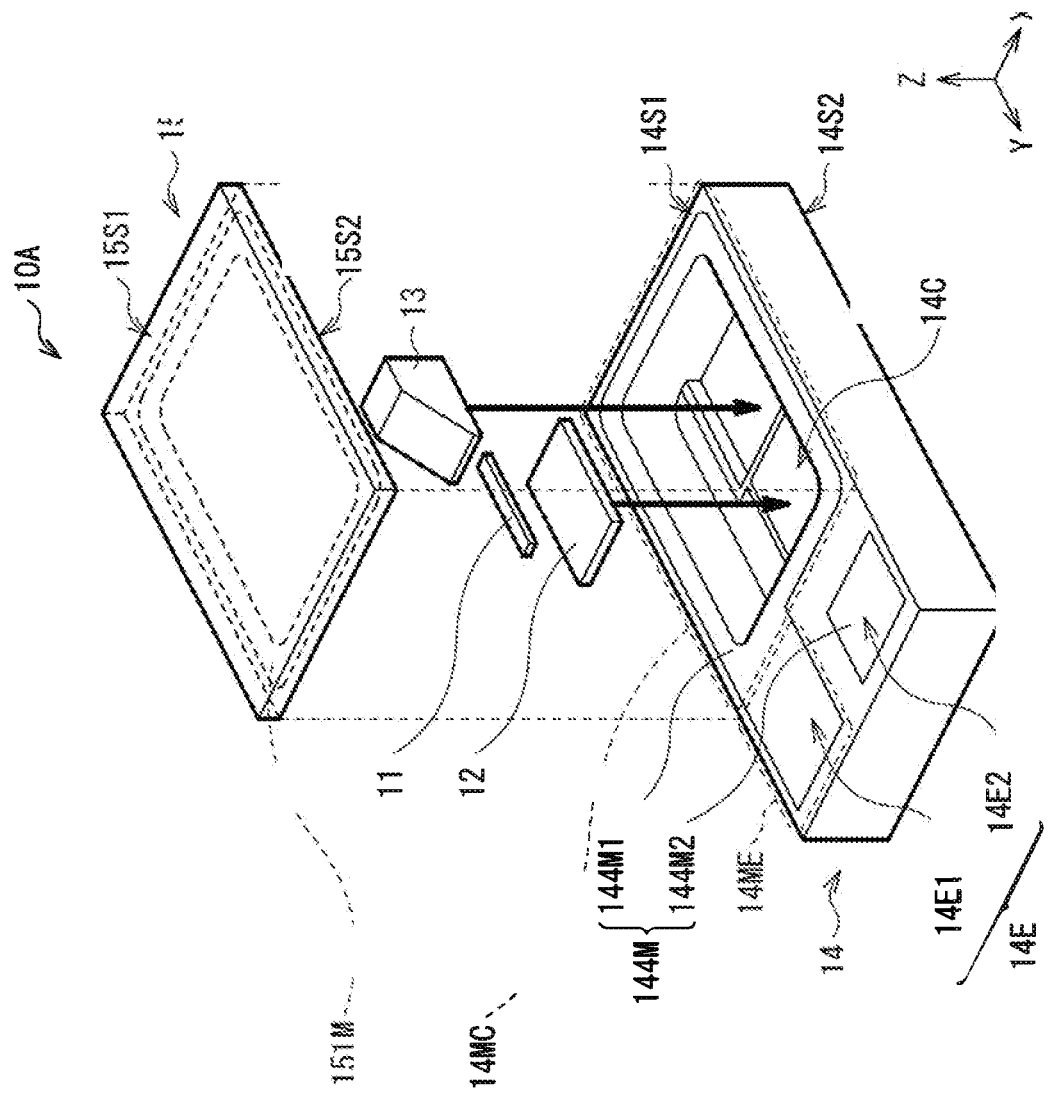

[ FIG. 3 ]
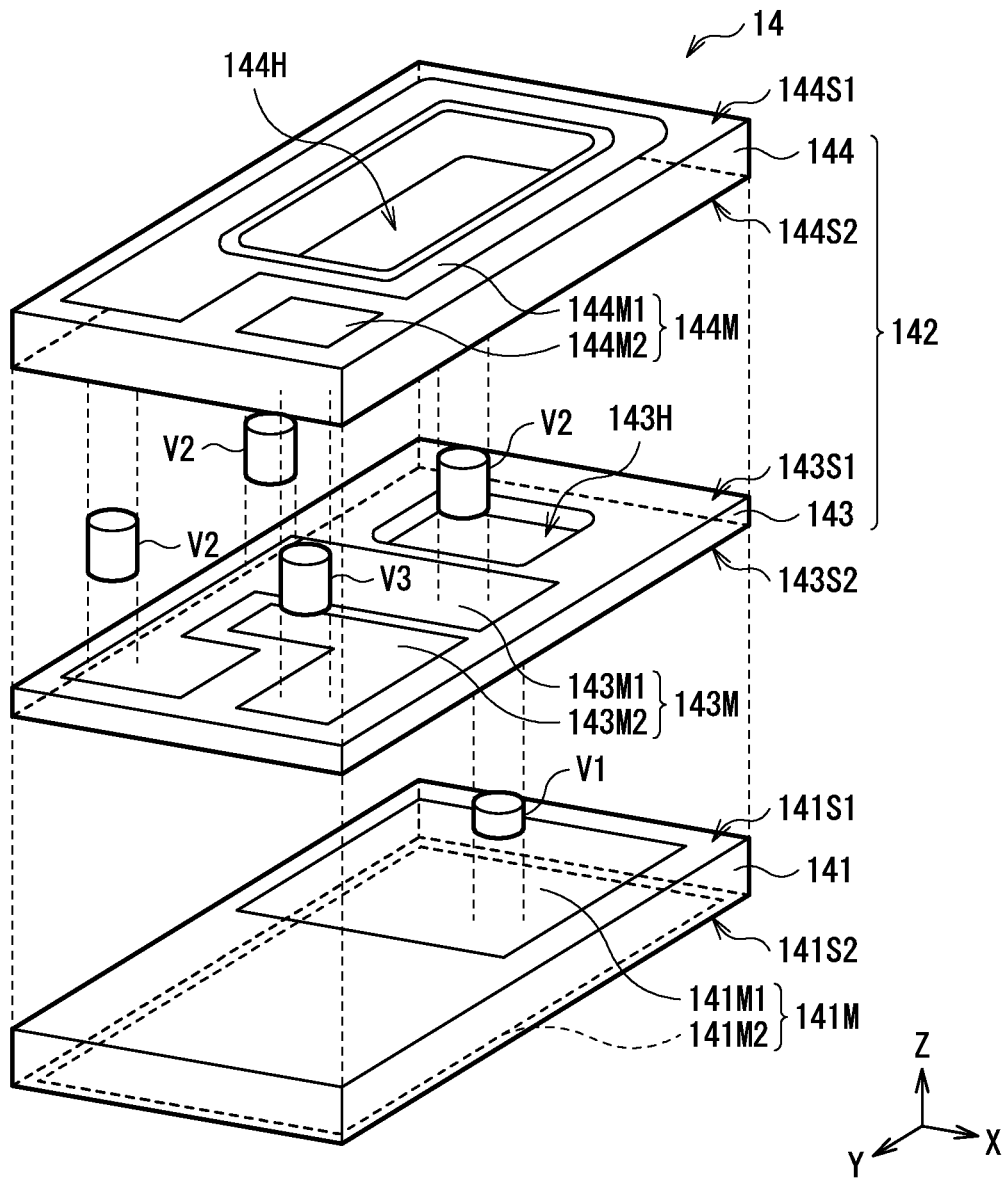

[ FIG. 4A ]
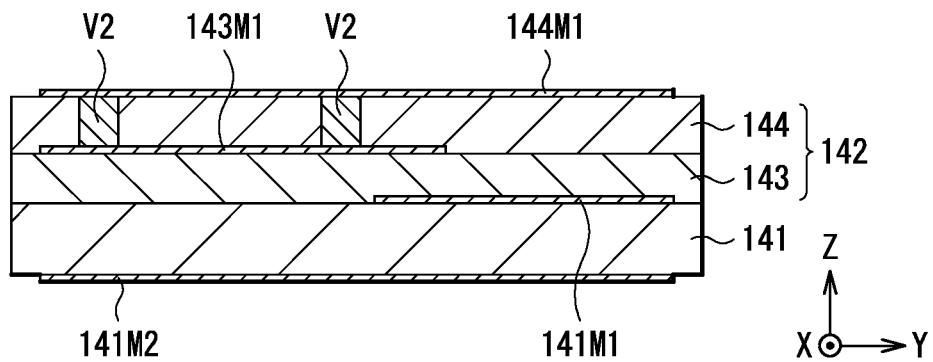
[ FIG. 4B ]
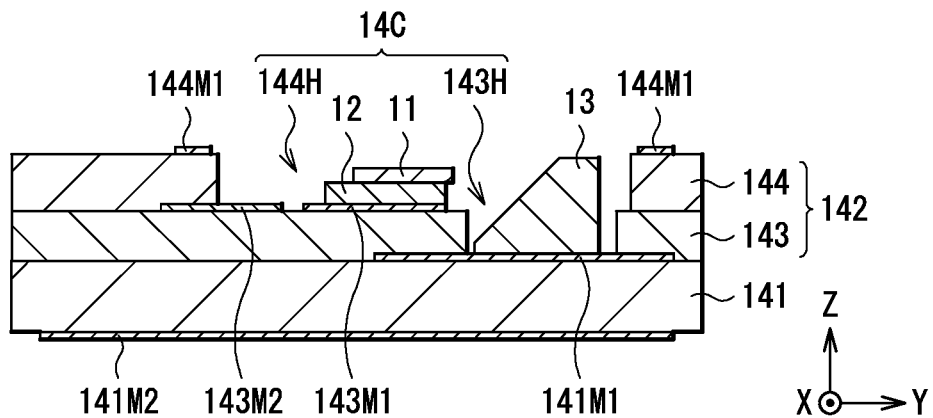
[ FIG. 4C ]
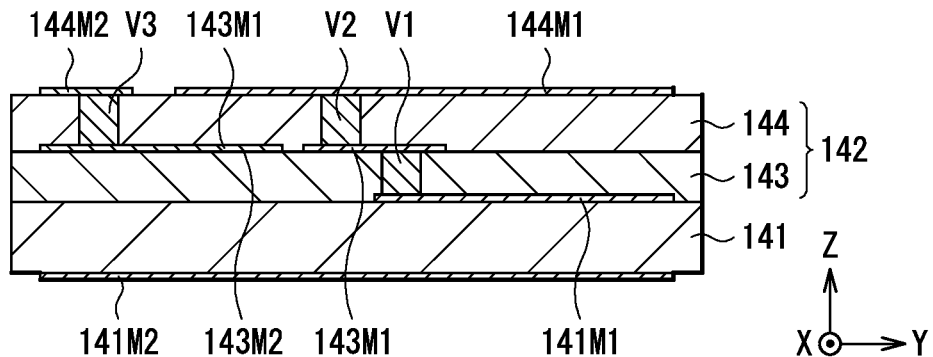

[ FIG. 5A ]
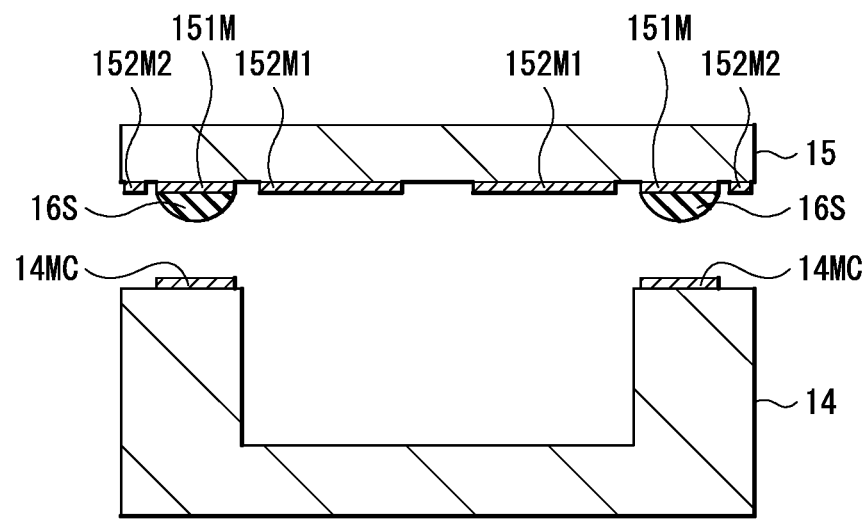
[ FIG. 5B ]
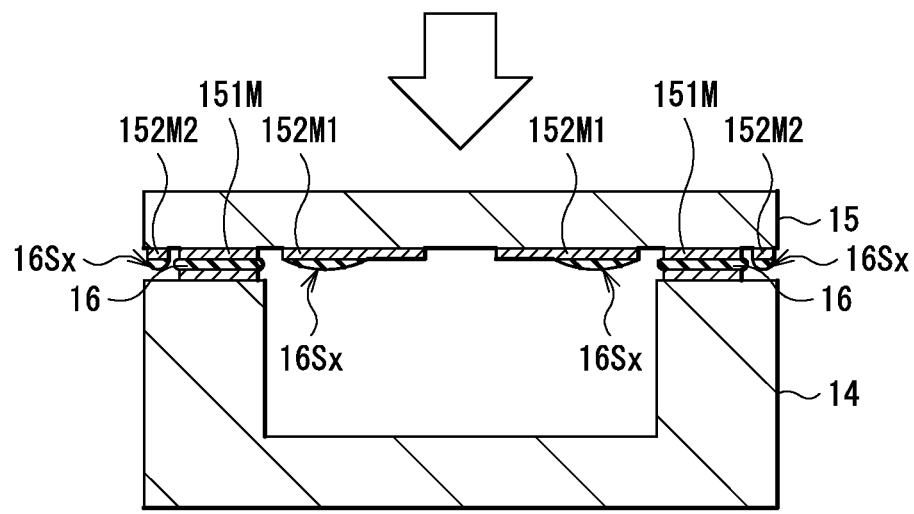

[ FIG. 6 ]
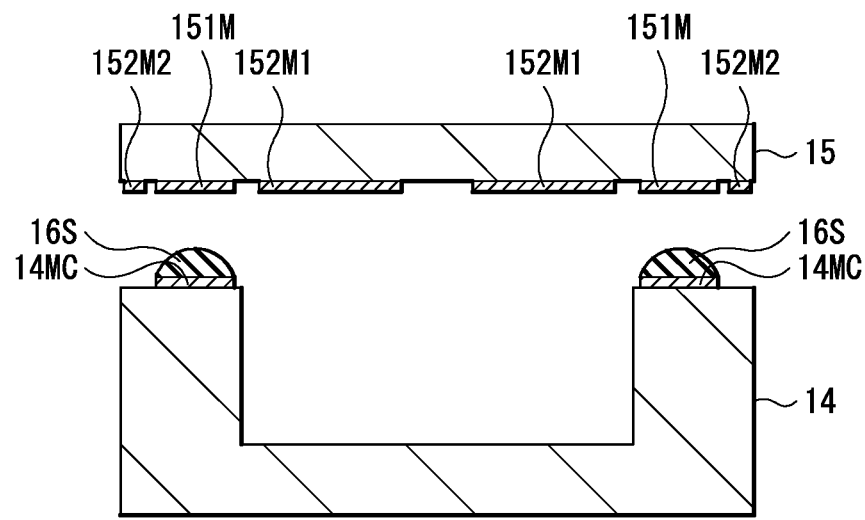
[ FIG. 7 ]
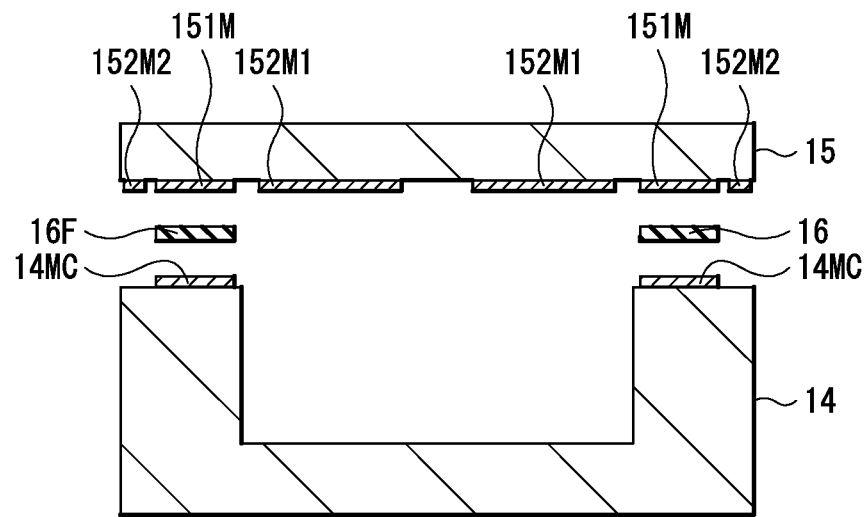

[ FIG. 8 ]
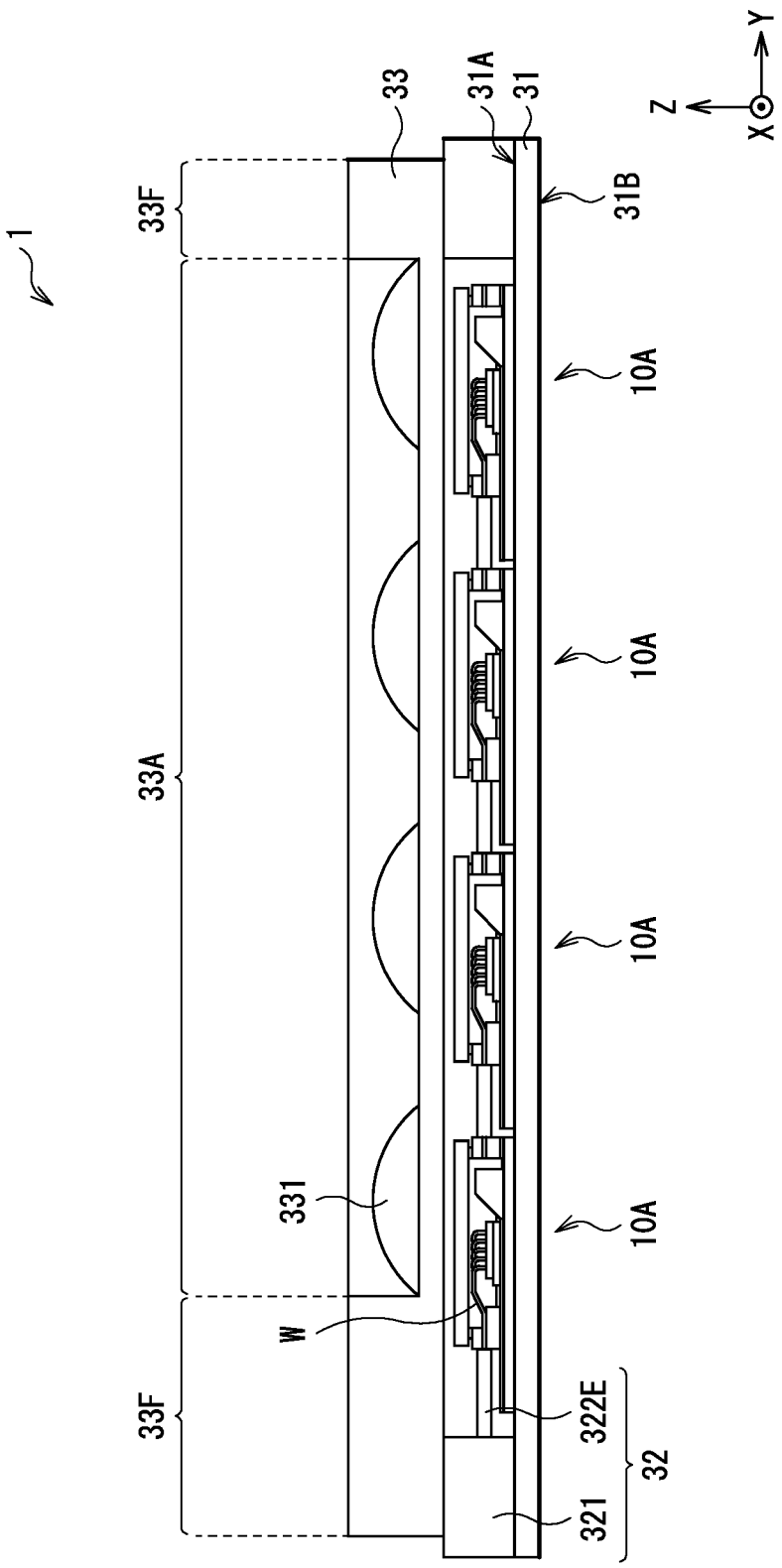

[ FIG. 9 ]
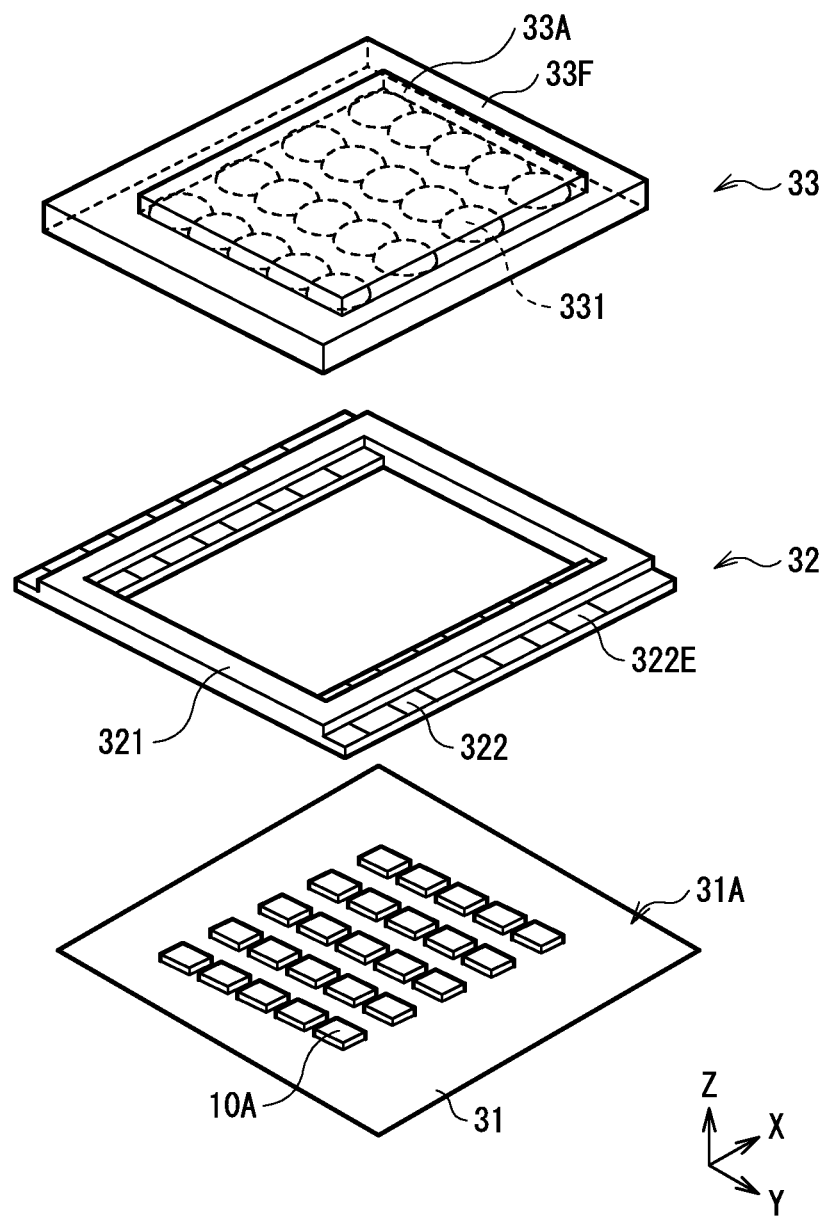

[ FIG. 10 ]
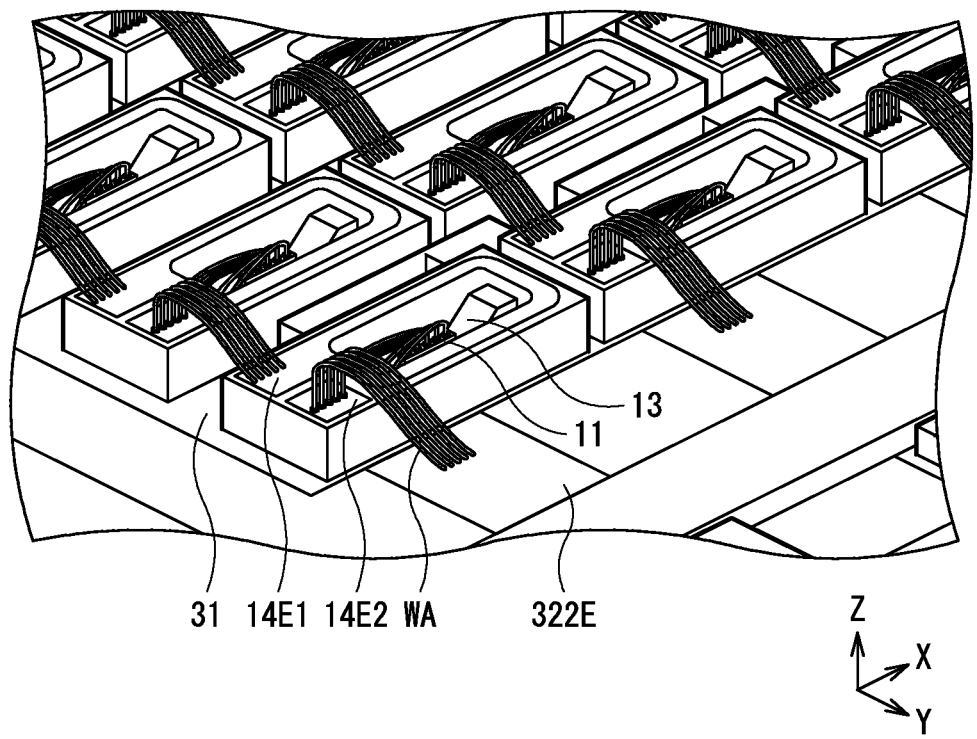

[ FIG. 11A ]
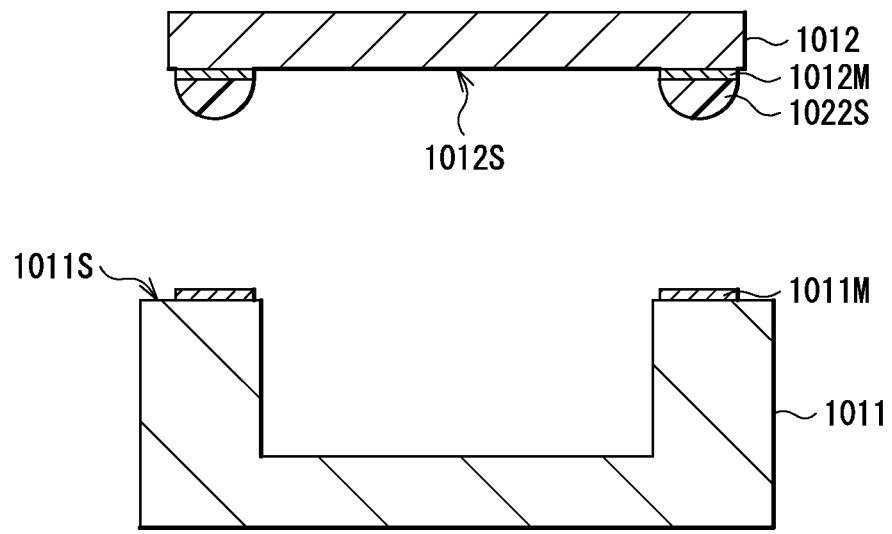
[ FIG. 11B ]
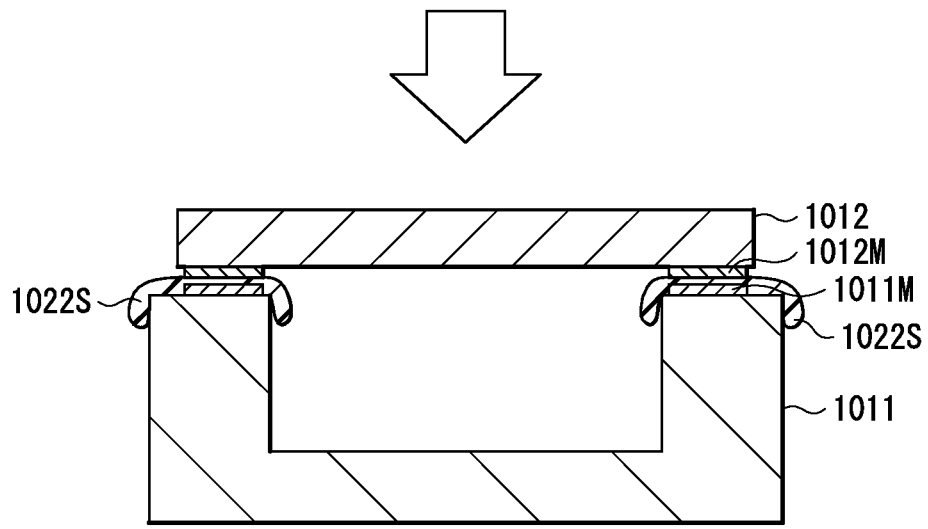

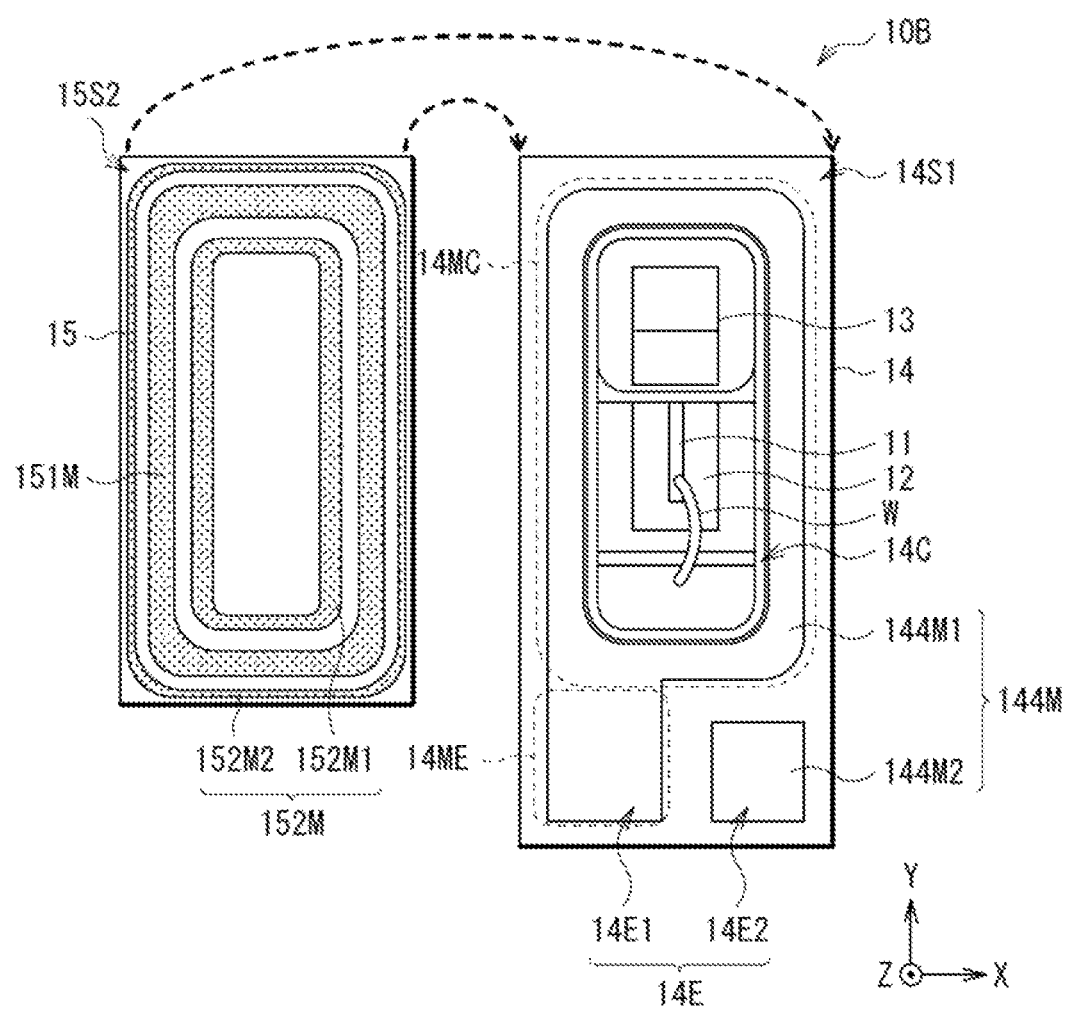
[ FIG. 12 ]

[ FIG. 13 ]
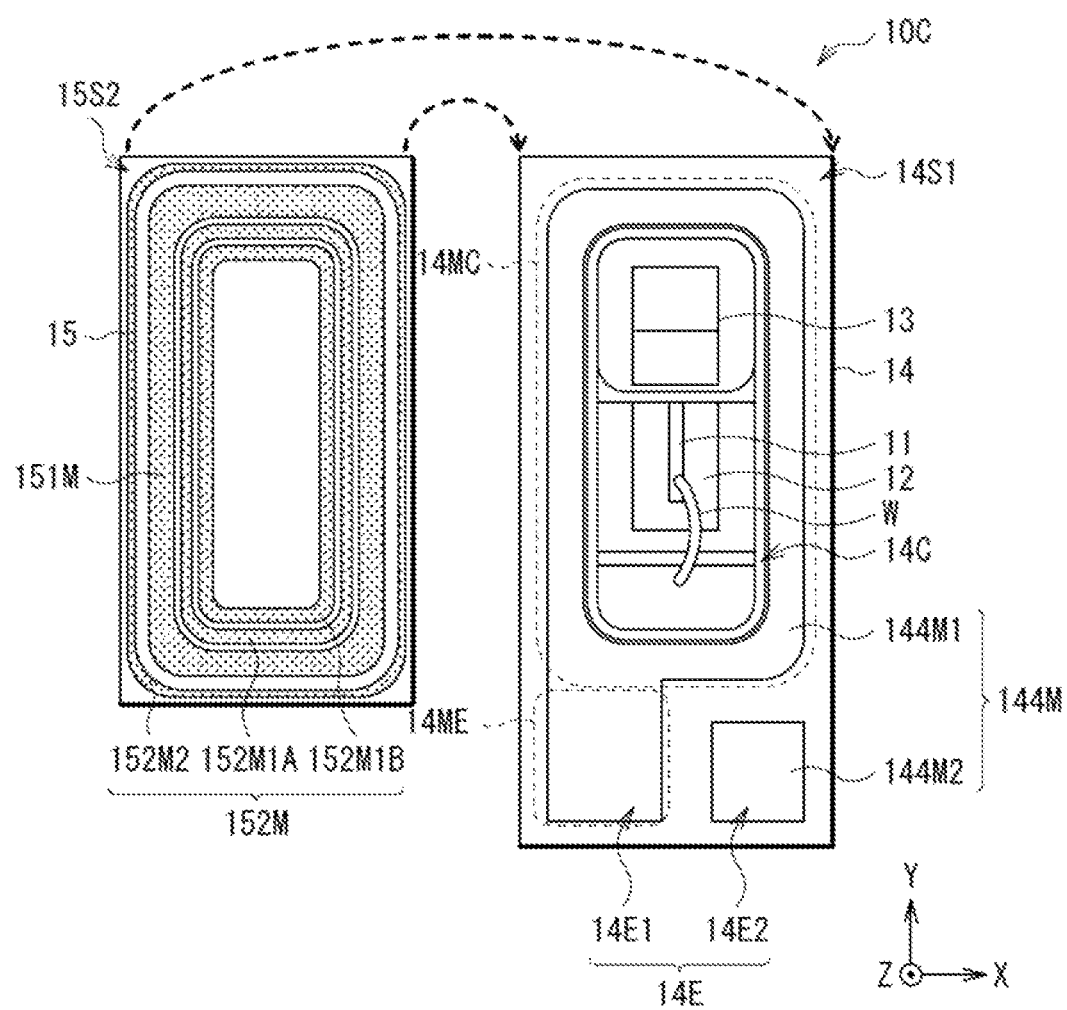

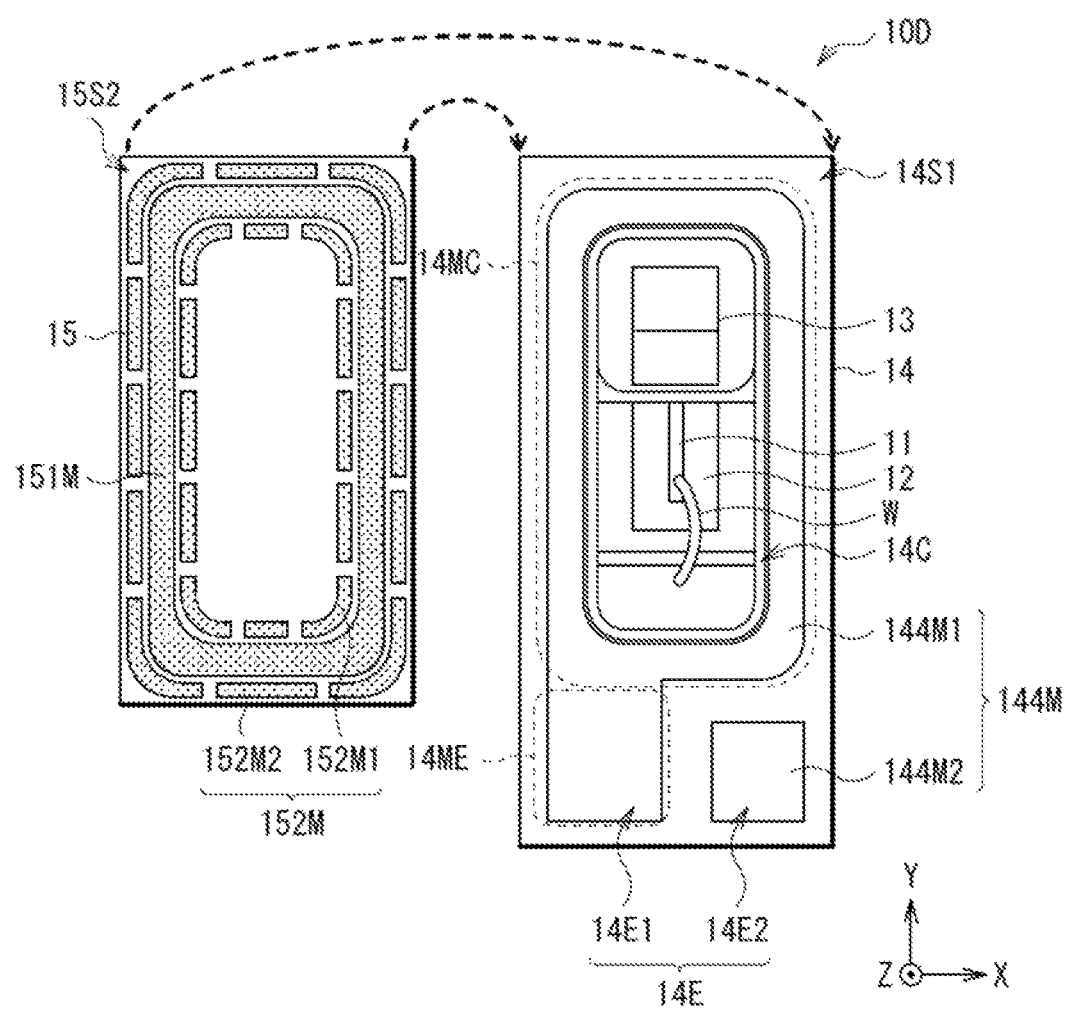
[FIG. 14]

[ FIG. 15A ]
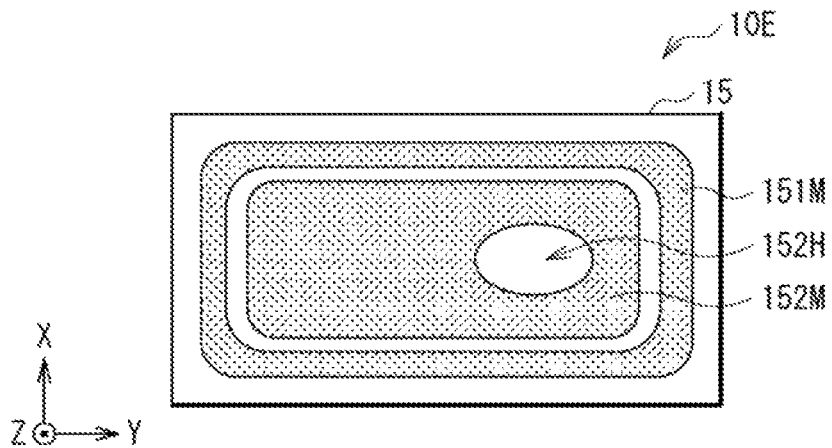
[ FIG. 15B ]
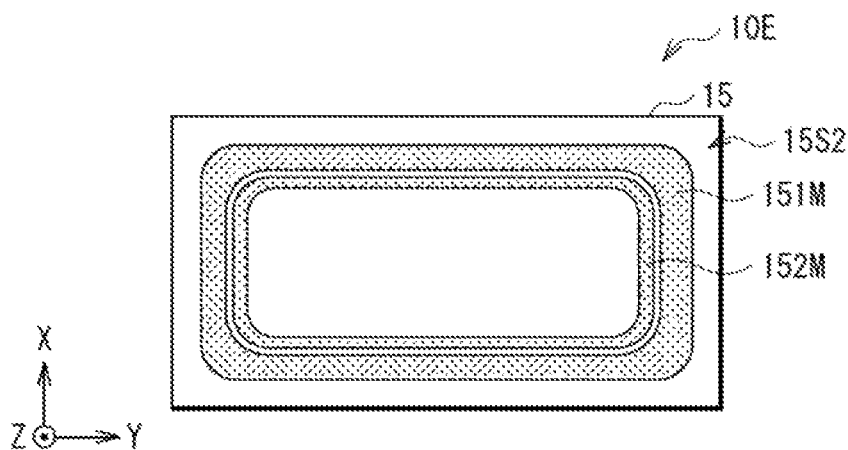
[ FIG. 15C ]
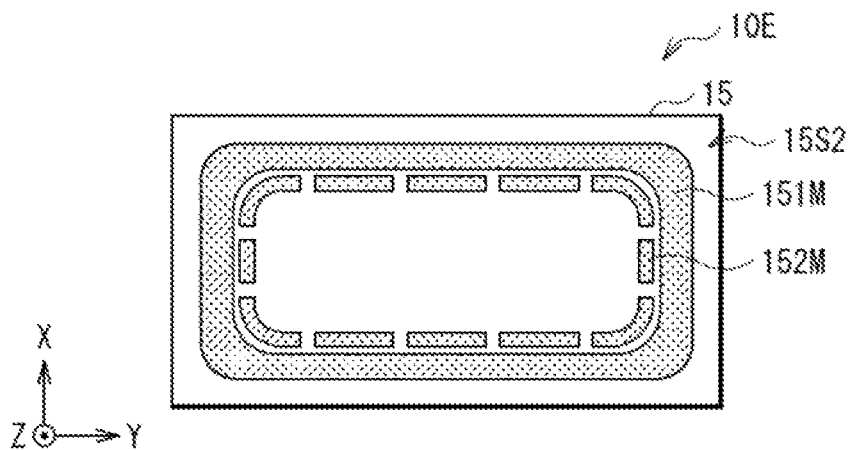

[ FIG. 16A ]
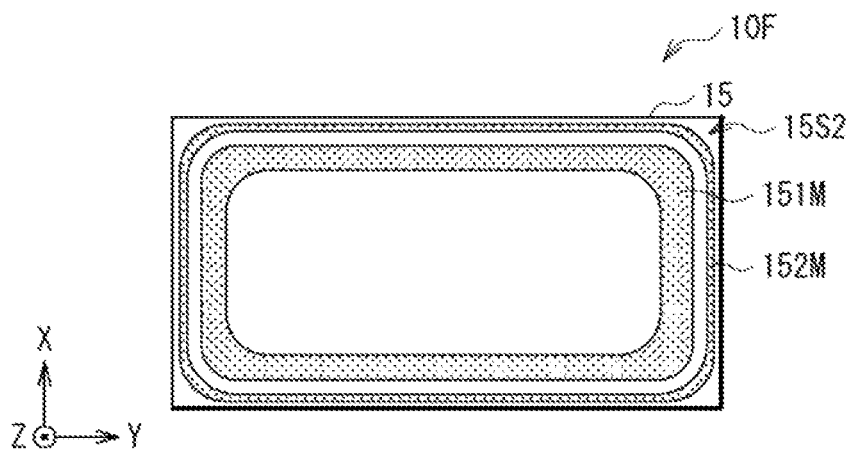
[ FIG. 16B ]
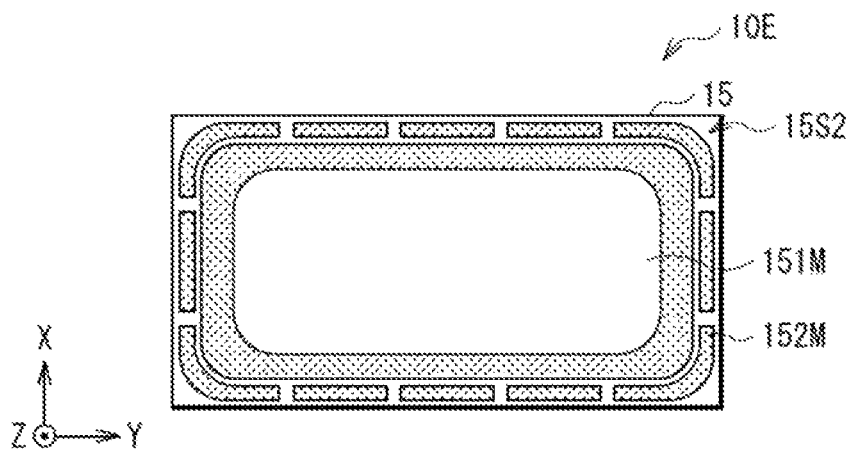

[ FIG. 17A ]
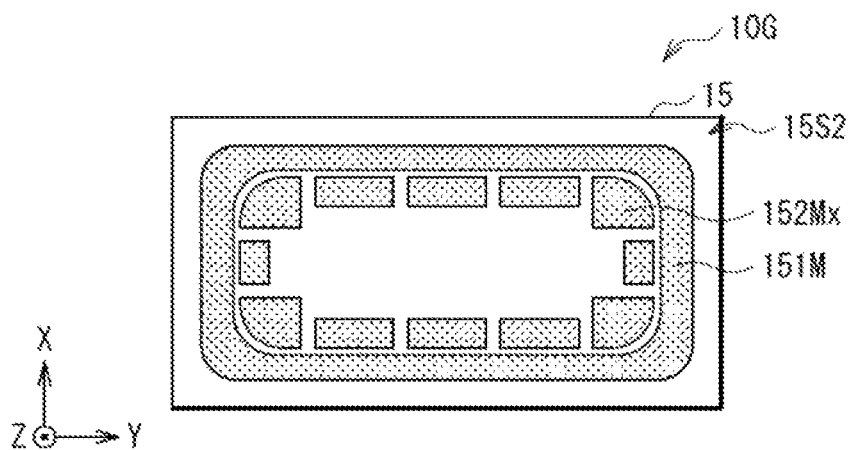
[ FIG. 17B ]
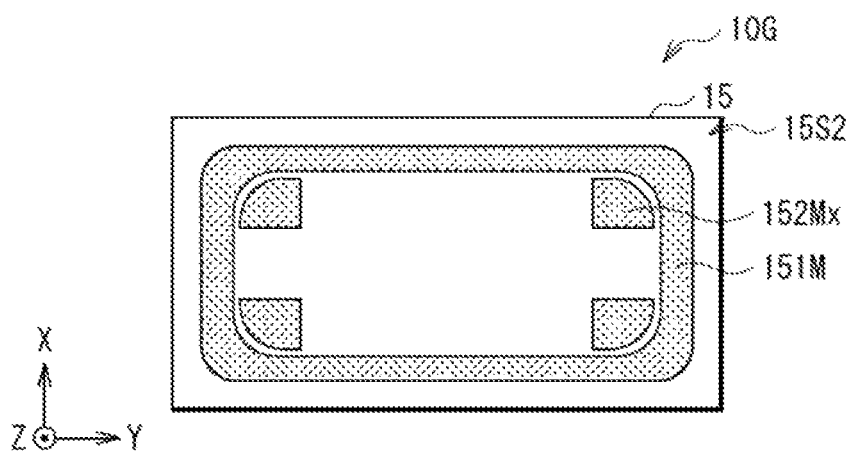

[FIG. 18A]
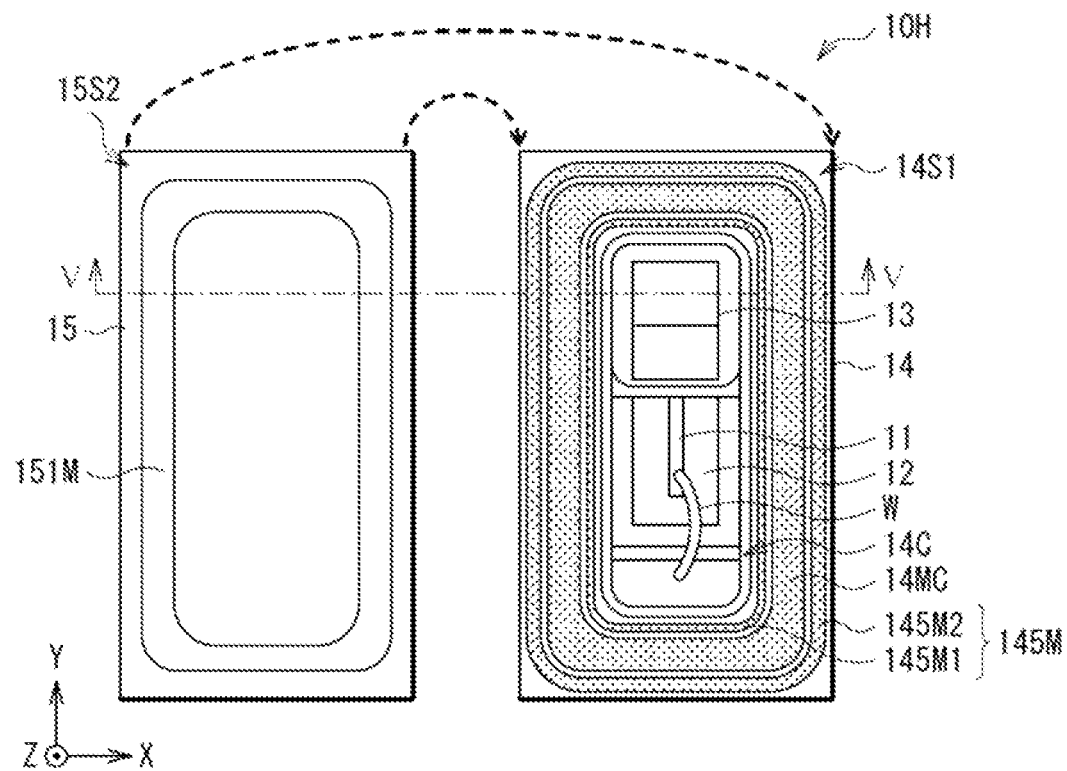
[FIG. 18B]
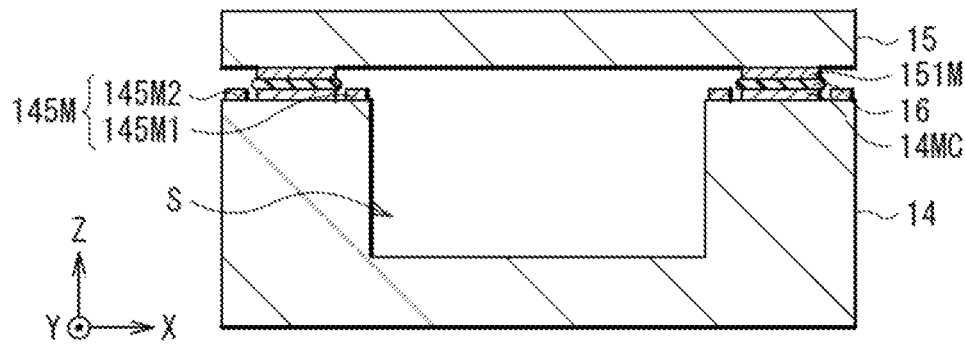
[FIG. 18C]
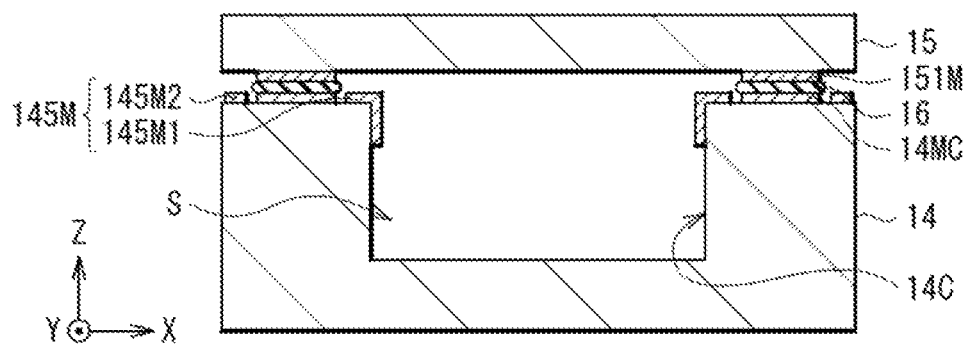

[FIG. 19A]
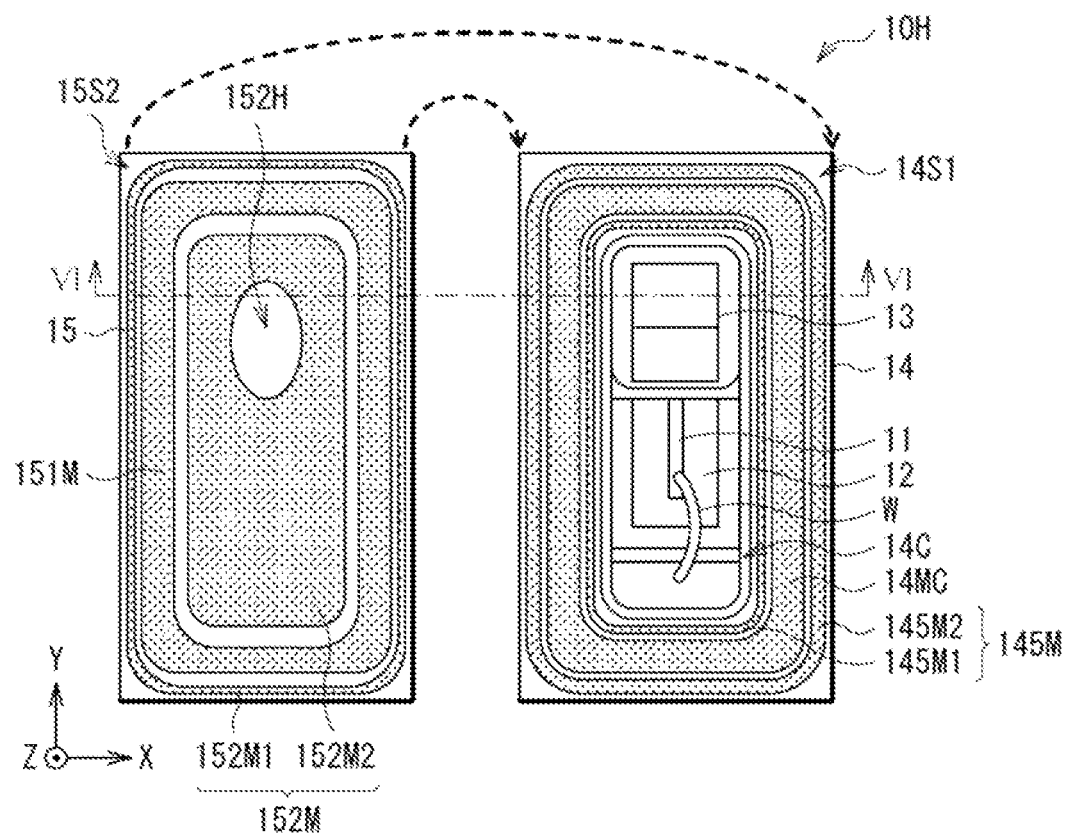
[FIG. 19B]
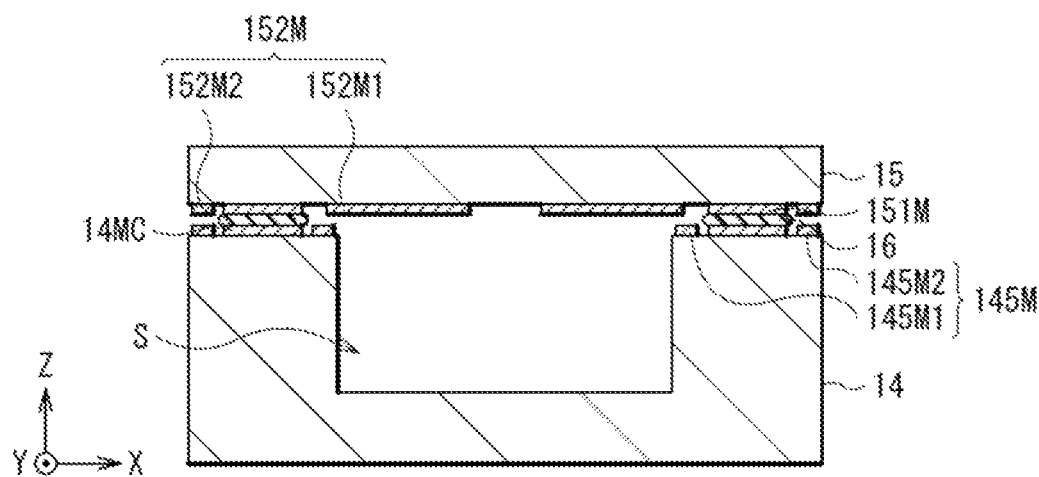

[ FIG. 20A ]
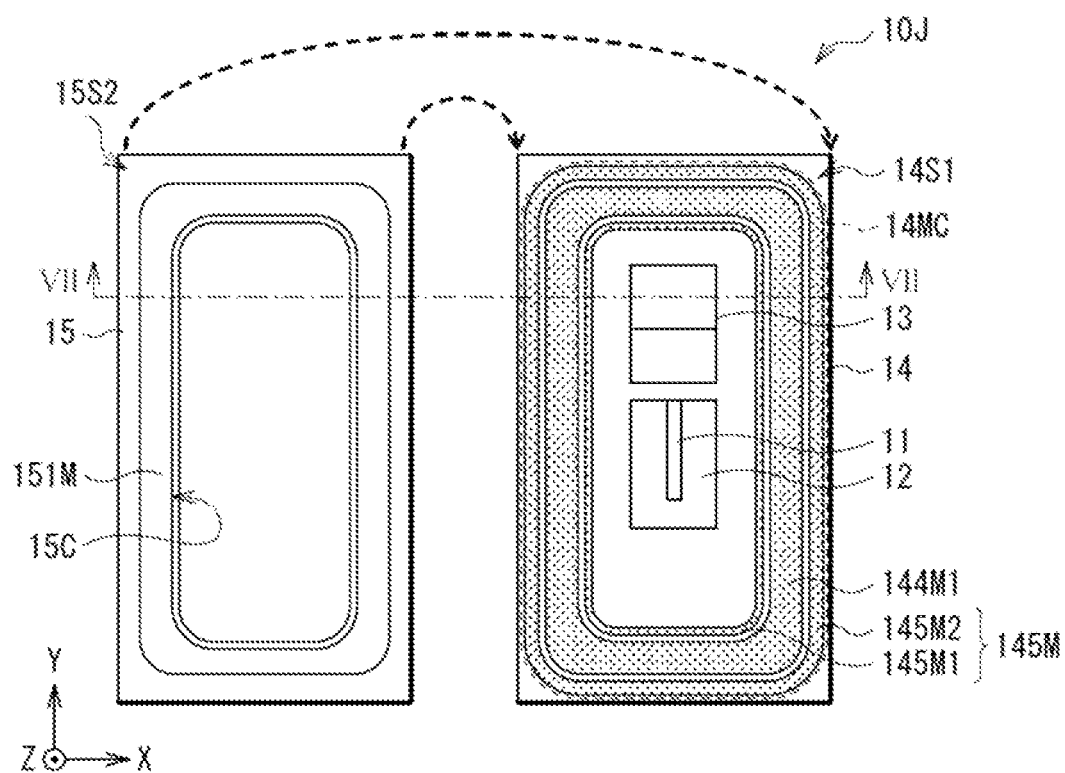
[ FIG. 20B ]
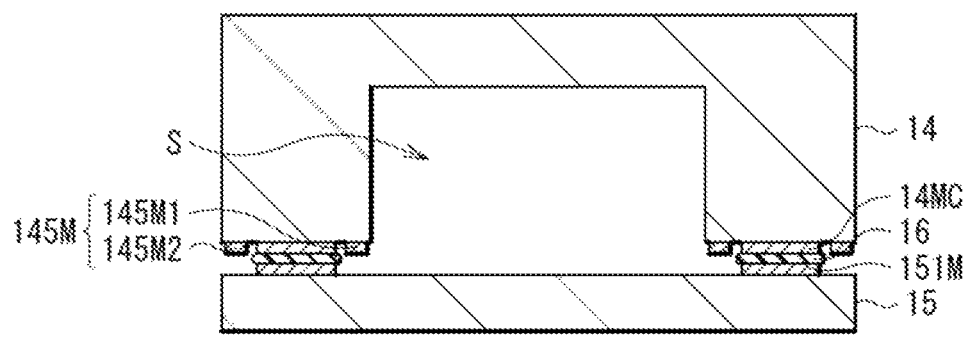

[ FIG. 21 ]
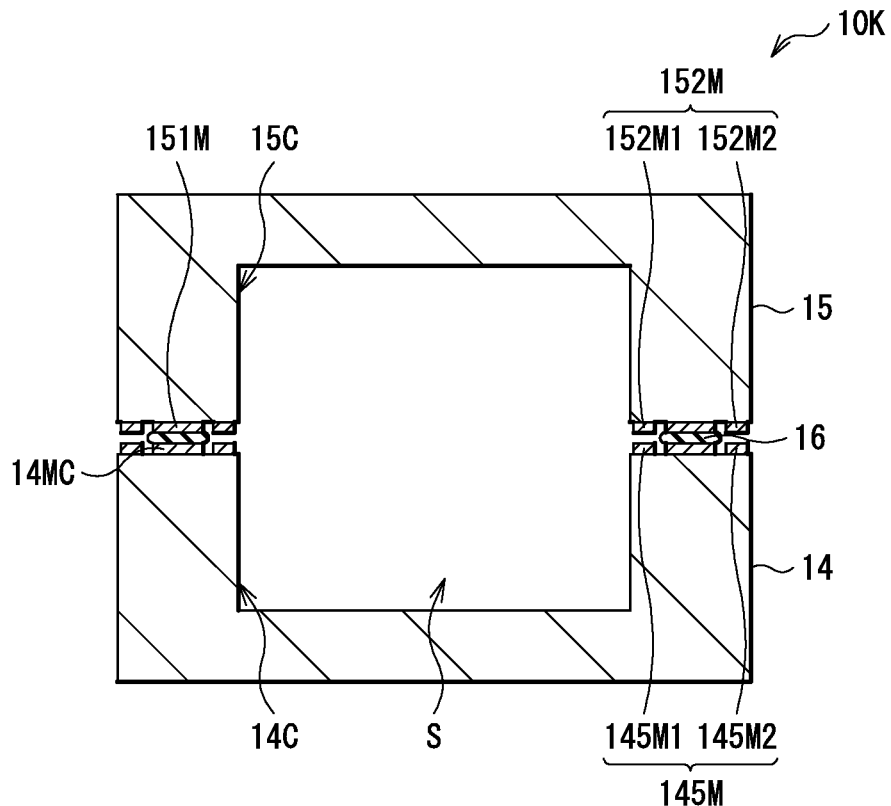
[ FIG. 22 ]
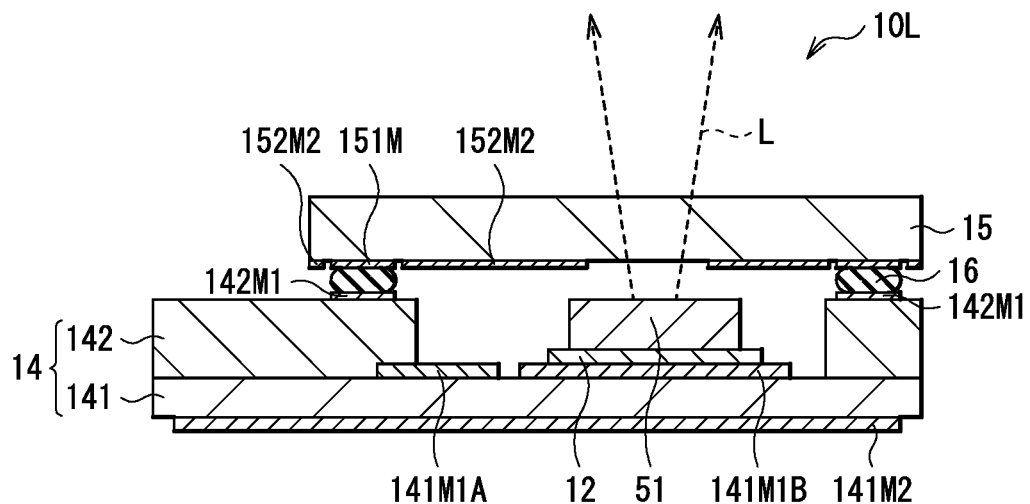

[ FIG. 23 ]
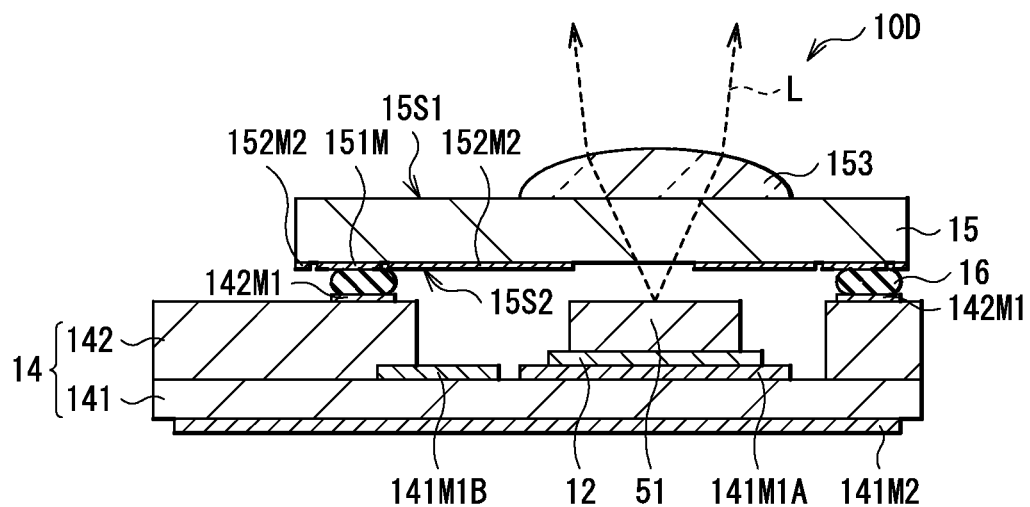
[ FIG. 24 ]
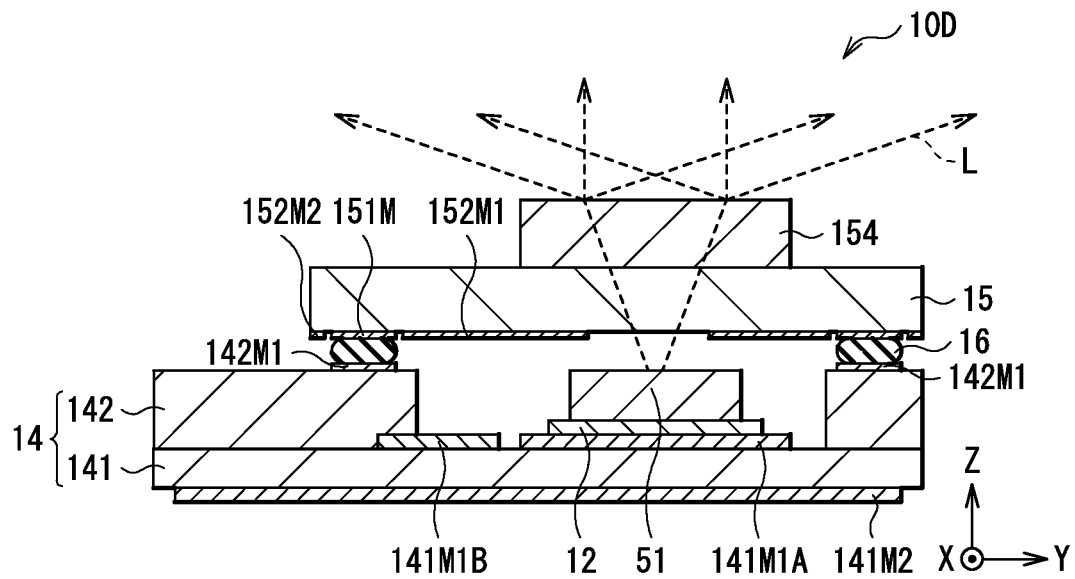

[FIG. 25A]
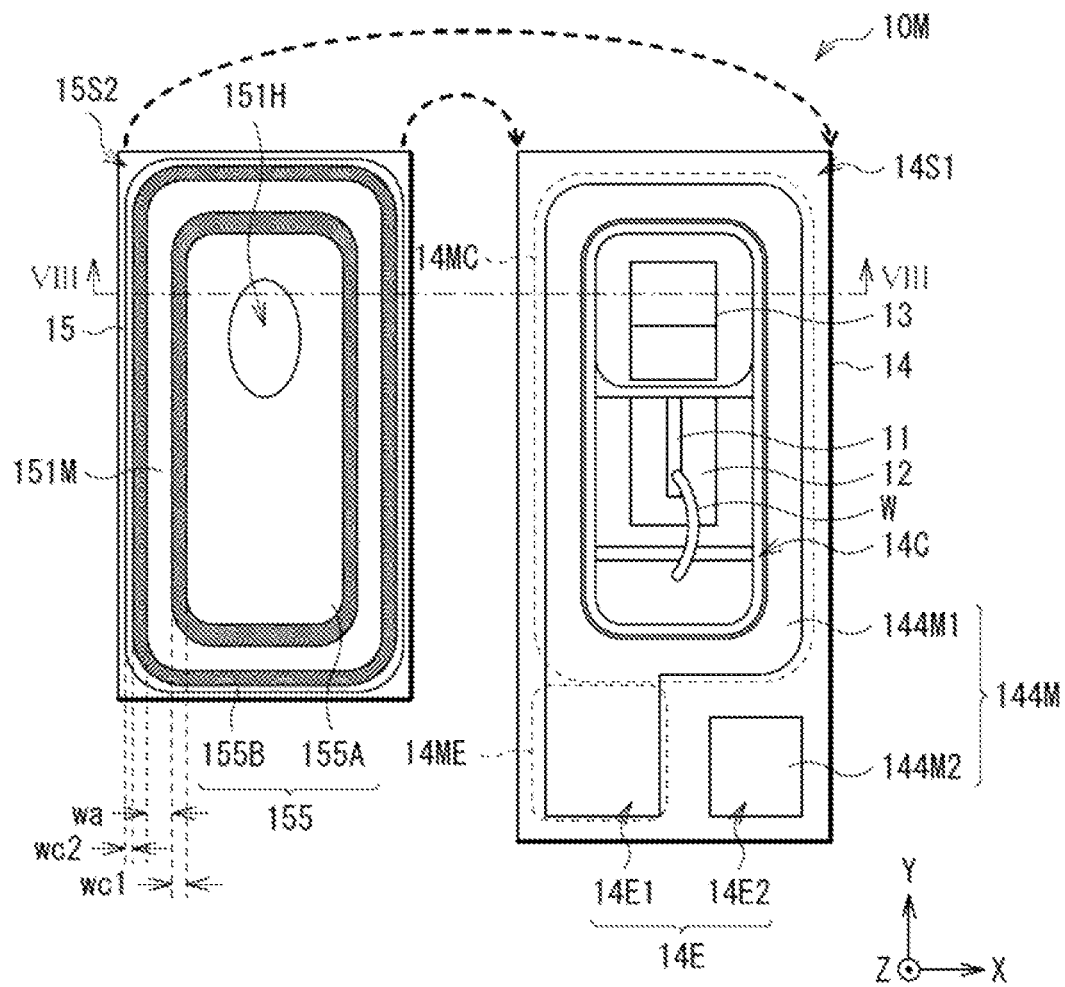
[FIG. 25B]
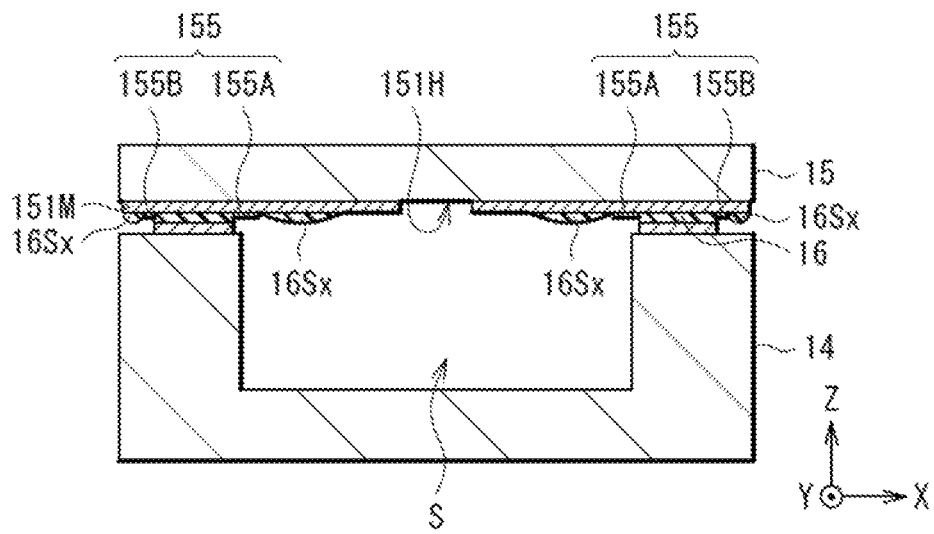

[ FIG. 26A ]
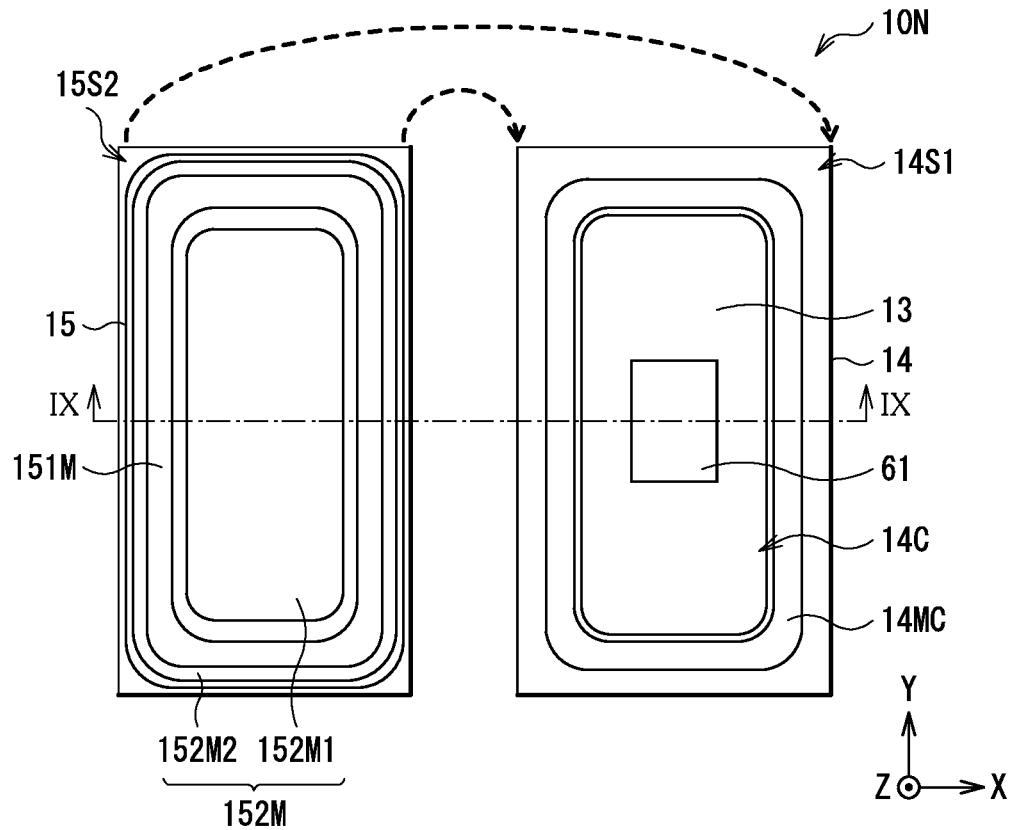
[ FIG. 26B ]
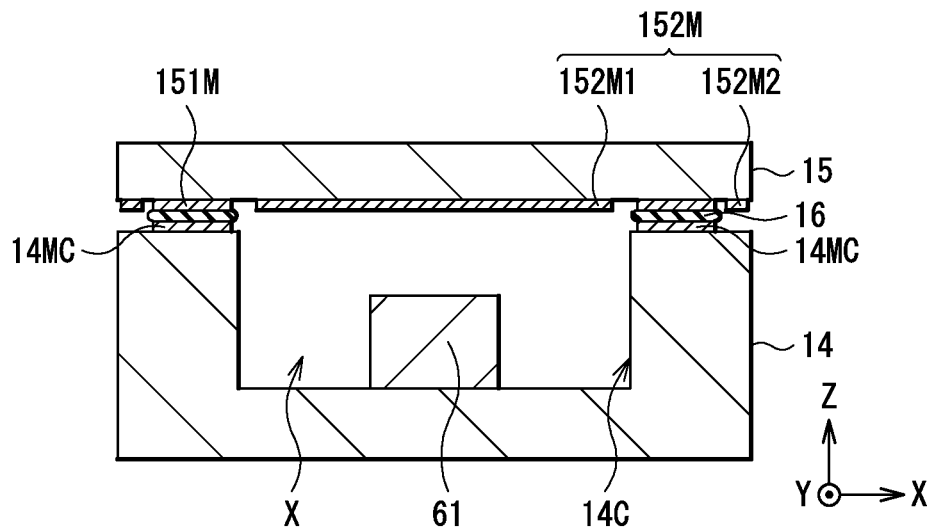

[ FIG. 27 ]
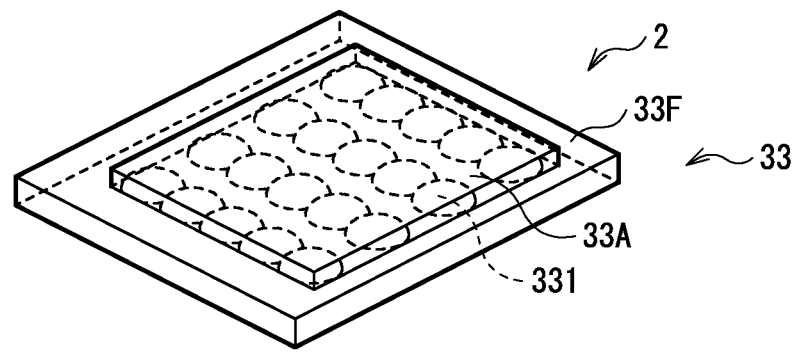
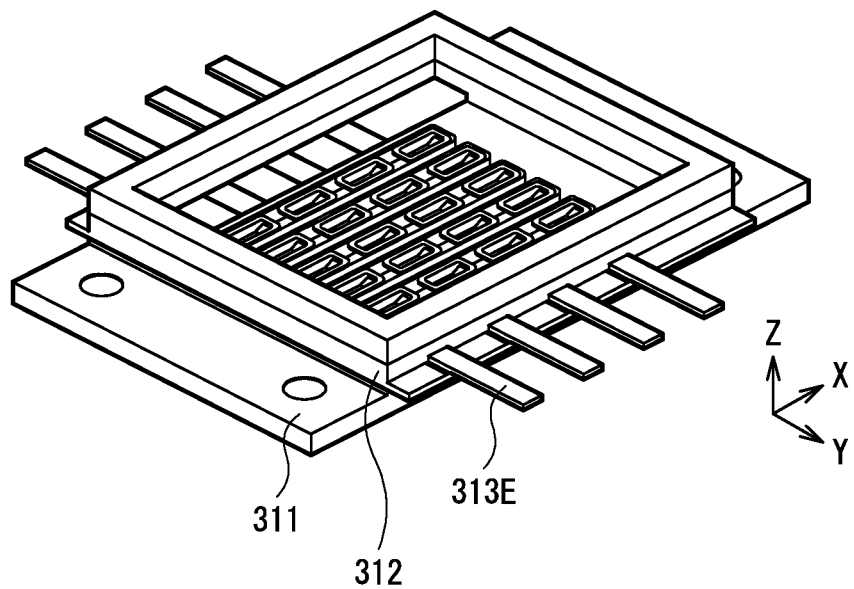

[ FIG. 28 ]
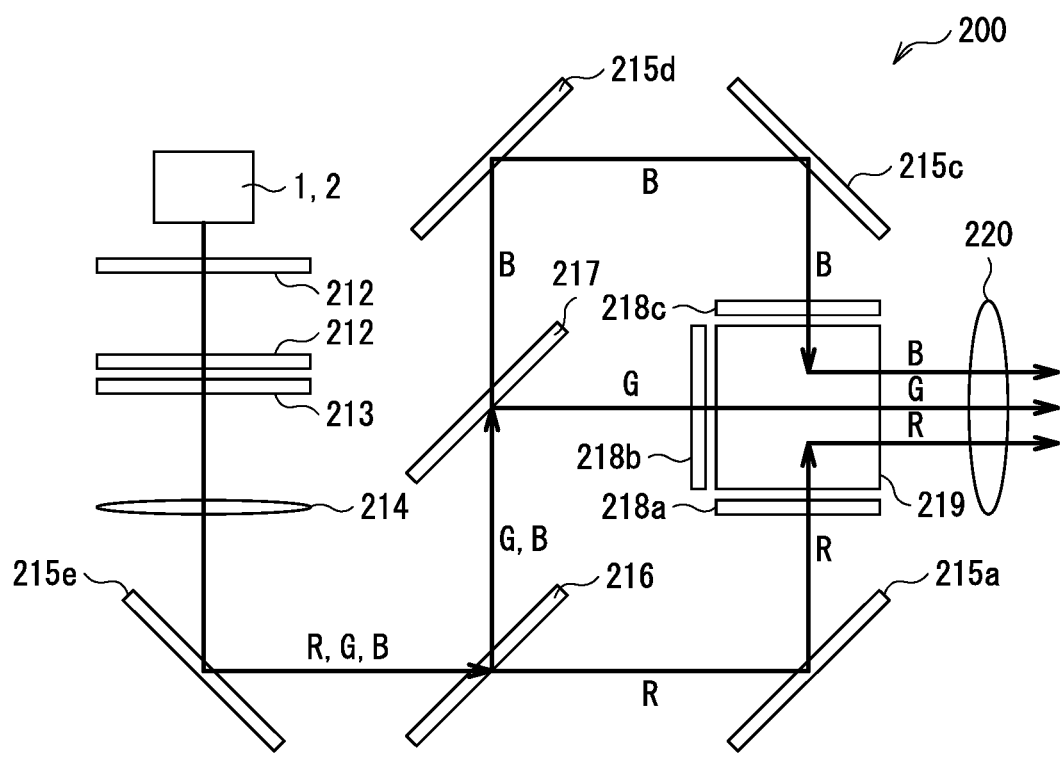

SEMICONDUCTOR DEVICE

TECHNICAL FIELD

The present technology relates to a semiconductor device including, for example, a semiconductor laser element or the like.

BACKGROUND ART

Semiconductor devices each including a plurality of light emitting elements such as semiconductor laser elements are under development. In the semiconductor device, the light emitting element is hermetically sealed in a package by solder, for example. For example, PTL 1 discloses a technique of, when sealing a substrate and a cover member by using solder, preventing occurrence of a short circuit due to spread of the solder and improving reliability. The technique provides a solder adsorption film that attracts the solder on an inner side of the cover member.

CITATION LIST

Patent Literature

PTL 1: Japanese Unexamined Patent Application Publication No. 2012-160526

SUMMARY OF THE INVENTION

A semiconductor device is thus requested to have improved reliability.

It is desirable to provide a semiconductor device that allows reliability to be improved.

A first semiconductor device according to an embodiment of the present disclosure includes: a semiconductor element; a first housing member and a second housing member that house the semiconductor element; a first base layer formed on a bonded surface of the first housing member to the second housing member; a second base layer formed on a bonded surface of the second housing member to the first housing member; a solder bonding section that bonds the first housing member and the second housing member with the first base layer and the second base layer interposed in between; and a solder adsorption layer provided on at least one of the bonded surface of the first housing member or the bonded surface of the second housing member to be apart from the first base layer and the second base layer.

In the first semiconductor device according to the embodiment of the present disclosure, as the base layers for the solder bonding section that bonds the first housing member and the second housing member, the first base layer and the second base layer are respectively provided on the corresponding bonded surfaces of the first housing member and the second housing member. Further, on at least one of the bonded surface of the first housing member or the bonded surface of the second housing member, the solder adsorption layer is provided at a position apart from the corresponding base layer. This prevents solder dripping inside a housing space in which the semiconductor element is housed and to an outer side of the housing member.

A second semiconductor device according to an embodiment of the present disclosure includes: a semiconductor element; a first housing member and a second housing member that house the semiconductor element; a first base layer formed on a bonded surface of the first housing member to the second housing member; a second base layer formed on a bonded surface of the second housing member to the first housing member; a solder bonding section that bonds the first housing member and the second housing member with the first base layer and the second base layer interposed in between; and a solder diffusion prevention layer provided on at least one of the first base layer or the second base layer and having different wettability from the first base layer and the second base layer.

In the second semiconductor device according to the embodiment of the present disclosure, as the base layers for the solder bonding section that bonds the first housing member and the second housing member, the first base layer and the second base layer are respectively provided on the corresponding bonded surfaces of the first housing member and the second housing member. On at least one of the first base layer or the second base layer, the solder diffusion prevention layer having different wettability from the corresponding base layer is provided. This prevents solder dripping inside a housing space in which the semiconductor element is housed and to an outer side of the housing member.

BRIEF DESCRIPTION OF DRAWING

FIG. 1A is a plane schematic diagram for describing a semiconductor device according to a first embodiment of the present disclosure.

FIG. 1B is a schematic diagram illustrating an example of a cross-sectional configuration of a main portion of the semiconductor device taken along a I-I line illustrated in FIG. 1A.

FIG. 2 is an exploded perspective view of an example of a configuration of the semiconductor device illustrated in FIGS. 1A and 1B.

FIG. 3 is an exploded perspective view of an example of a configuration of a housing member illustrated in FIGS. 1A and 1B.

FIG. 4A is a cross-sectional schematic diagram of the semiconductor device taken along an II-II line illustrated in FIG. 1A.

FIG. 4B is a cross-sectional schematic diagram of the semiconductor device taken along an line illustrated in FIG. 1A.

FIG. 4C is a cross-sectional schematic diagram of the semiconductor device taken along an IV-IV line illustrated in FIG. 1A.

FIG. 5A is a cross-sectional schematic diagram describing solder bonding between a cover and the housing member according to the present disclosure.

FIG. 5B is a cross-sectional schematic diagram, subsequent to FIG. 5A, describing the solder bonding between the cover and the housing member.

FIG. 6 is a cross-sectional schematic diagram illustrating another example of a method of the solder bonding between the cover and the housing member according to the present disclosure.

FIG. 7 is a cross-sectional schematic diagram illustrating another example of the method of the solder bonding between the cover and the housing member according to the present disclosure.

FIG. 8 is a side schematic diagram illustrating an example of an outline configuration of a light emitting apparatus including the semiconductor device illustrated in FIGS. 1A and 1B.

FIG. 9 is an exploded perspective view of a schematic configuration of the light emitting apparatus illustrated in FIG. 8.

FIG. 10 is a perspective view for describing coupling between the semiconductor device and a terminal section of a lens holding member illustrated in FIG. 8.

FIG. 11A is a cross-sectional schematic diagram describing solder bonding between a lid member and a package member as a reference example.

FIG. 11B is a cross-sectional schematic diagram, subsequent to FIG. 11A, describing the solder bonding between the lid member and the package member.

FIG. 12 is a plane schematic diagram for describing a semiconductor device according to a modification example 1 of the present disclosure.

FIG. 12 is a plane schematic diagram for describing a semiconductor device according to a modification example 2 of the present disclosure.

FIG. 12 is a plane schematic diagram for describing a semiconductor device according to a modification example 3 of the present disclosure.

FIG. 15A is a plane schematic diagram for describing an example of a semiconductor device according to a modification example 4 of the present disclosure.

FIG. 15B is a plane schematic diagram for describing another example of the semiconductor device according to the modification example 4 of the present disclosure.

FIG. 15C is a plane schematic diagram for describing another example of the semiconductor device according to the modification example 4 of the present disclosure.

FIG. 16A is a plane schematic diagram for describing an example of a semiconductor device according to a modification example 5 of the present disclosure.

FIG. 16B is a plane schematic diagram for describing another example of the semiconductor device according to the modification example 5 of the present disclosure.

FIG. 17A is a plane schematic diagram for describing an example of a semiconductor device according to a modification example 6 of the present disclosure.

FIG. 17B is a plane schematic diagram for describing another example of the semiconductor device according to the modification example 6 of the present disclosure.

FIG. 18A is a plane schematic diagram for describing a semiconductor device according to a modification example 7 of the present disclosure.

FIG. 18B is a schematic diagram illustrating an example of a cross-sectional configuration of a main portion of the semiconductor device taken along a V-V line illustrated in FIG. 18A.

FIG. 18C is a schematic diagram illustrating another example of the cross-sectional configuration of the main portion of the semiconductor device taken along the V-V line illustrated in FIG. 18A.

FIG. 19A is a plane schematic diagram for describing a semiconductor device according to a modification example 8 of the present disclosure.

FIG. 19B is a schematic diagram illustrating an example of a cross-sectional configuration of a main portion of the semiconductor device taken along a VI-VI line illustrated in FIG. 19A.

FIG. 20A is a plane schematic diagram for describing a semiconductor device according to a modification example 9 of the present disclosure.

FIG. 20B is a schematic diagram illustrating a cross-sectional configuration of a main portion of the semiconductor device taken along a VII-VII line illustrated in FIG. 20A.

FIG. 21 is a schematic diagram illustrating a cross-sectional configuration of a main portion of a semiconductor device according to a modification example 10 of the present disclosure.

FIG. 22 is a cross-sectional schematic diagram illustrating an example of a configuration of a semiconductor device according to a modification example 11 of the present disclosure.

FIG. 23 is a cross-sectional schematic diagram illustrating another example of the configuration of the semiconductor device according to the modification example 11 of the present disclosure.

FIG. 24 is a cross-sectional schematic diagram illustrating another example of the configuration of the semiconductor device according to the modification example 11 of the present disclosure.

FIG. 25A is a plane schematic diagram for describing a semiconductor device according to a second embodiment of the present disclosure.

FIG. 25B is a schematic diagram illustrating an example of a cross-sectional configuration of a main portion of the semiconductor device taken along a VIII-VIII line illustrated in FIG. 25A.

FIG. 26A is a plane schematic diagram for describing a semiconductor device according to a modification example 12 of the present disclosure.

FIG. 26B is a schematic diagram illustrating an example of a cross-sectional configuration of the semiconductor device taken along an IX-IX line illustrated in FIG. 26A.

FIG. 27 is an exploded perspective view of an example of a configuration of a light emitting apparatus according to a modification example 13 of the present disclosure.

FIG. 28 is a diagram illustrating an example of a configuration of a projection display to which the light emitting apparatus illustrated in FIG. 8 or the like is applied.

MODES FOR CARRYING OUT THE INVENTION

The following describes embodiments of the present disclosure in detail with reference to the drawings. The following description is a specific example of the present disclosure, but the present disclosure is not limited to the following modes. In addition, the present disclosure is not also limited to the disposition, dimensions, dimension ratios, and the like of the respective components illustrated in the respective diagrams. It is to be noted that description is given in the following order.
1. First Embodiment (Example of a semiconductor device including a solder adsorption layer on an inner side and an outer side of a base layer formed in a frame shape)
   1-1. Configuration of Semiconductor Device
   1-2. Configuration of Light Emitting Apparatus
   1-3. Workings and Effects
2. Modification Examples
   2-1. Modification Example 1 (Example in which a solder adsorption layer on the inner side is provided in a frame shape)
   2-2. Modification Example 2 (Example in which a solder adsorption layer on the inner side is provided doubly)
   2-3. Modification Example 3 (Example in which a solder adsorption layer on the inner side and the outer side is provided in a plurality of island shapes)
   2-4. Modification Example 4 (Example in which a solder adsorption layer is provided only on an inner mold of a base layer formed in a frame shape)

2-5. Modification Example 5 (Example in which a solder adsorption layer is provided only on an outer mold of a base layer formed in a frame shape)

2-6. Modification Example 6 (Example in which a solder adsorption layer at a corner on the inner side is enlarged)

2-7. Modification Example 7 (Example in which a solder adsorption layer is provided on a housing member side)

2-8. Modification Example 8 (Example in which a solder adsorption layer is provided on both a cover and a housing section)

2-9. Modification Example 9 (Example including a recessed section that houses a semiconductor element on a cover side)

2-10. Modification Example 10 (Example including a recessed section on both a housing member and a cover)

2-11. Modification Example 11 (Example in which a vertical resonator surface emitting laser is used)

3. Second Embodiment (Example of a semiconductor device including a solder diffusion prevention layer on a base layer)

4. Modification Examples 4-1. Modification Example 12 (Example in which a discrete semiconductor is used as a semiconductor element)

4-2. Modification Example 13 (Another example of a configuration of a display) 4-3. Modification Example 14 (Another example of a configuration of a display)

5. Application Example (Example of a projection display)

1. First Embodiment

FIG. 1A is a plane schematic diagram for describing a configuration of a semiconductor device (semiconductor device 10A) according to a first embodiment of the present disclosure. FIG. 1B schematically illustrates an example of a cross-sectional configuration of a main portion of the semiconductor device 10A taken along a I-I line illustrated in FIG. 1A. FIG. 2 is an exploded perspective view of an example of a configuration of the semiconductor device 10A illustrated in FIG. 1A. The semiconductor device 10A is a packaged surface mount device (surface mount device; SMD). The semiconductor device 10A includes a light emitting element 11, a housing member 14, and a cover 15. The housing member 14 includes a recessed section 14C and the light emitting element 11 is housed in this recessed section 14C. An upper surface (bonded surface 14S1) of the housing member 14 and a lower surface 15S2 of the cover 15 are respectively provided with metal patterns 14MC and 151M. The housing member 14 and the cover 15 are bonded to each other with these metal patterns 14MC and 151M and a solder bonding section 16 interposed in between. This hermetically seals (hermetic seal) the light emitting element 11. The lower surface 15S2 of the cover 15 is further provided with a solder adsorption layer 152M on an inner side and an outer side with respect to the metal pattern 151M. This light emitting element 11 corresponds to a specific example of a "semiconductor element" of the present disclosure. The housing member 14 corresponds to a specific example of a "first housing member" of the present disclosure and the cover 15 corresponds to a specific example of a "second housing member" of the present disclosure. The metal pattern 14MC corresponds to a "first base layer" of the present disclosure and the metal pattern 151M corresponds to a specific example of a "second base layer" of the present disclosure. Metal patterns 152M1 and 152M2 correspond to a specific example of a "solder adsorption layer" of the present disclosure. It is to be noted that the cross-sectional diagram illustrated in FIG. 1B omits each member that is mounted in the housing member 14, such as the light emitting element 11. The same applies to the following.

1-1. Configuration of Semiconductor Device

In the semiconductor device 10A according to the present embodiment, the light emitting element 11 is housed in the recessed section 14C of the housing member 14, for example, along with a submount 12 and a mirror 13. The housing member 14 is bonded to the cover 15 with the metal patterns 14MC and 151M and the solder bonding section 16 interposed in between, and hermetically seals the light emitting element 11, the submount 12, and the mirror 13 along with the cover 15. The lower surface 15S2 of the cover 15 is further provided with, as the solder adsorption layer 152M, the metal pattern 152M1 and the metal pattern 152M2 respectively on the inner side and the outer side with respect to the metal pattern 151M. The housing member 14 may be further provided with a wiring structure for electrically coupling the light emitting element 11 and the outside. This is described in detail below. In this case, the solder bonding section 16 may be electrically coupled to this wiring structure. Along with the wiring structure, the solder bonding section 16 may be included in an electrical conduction path that electrically couples the light emitting element 11 and the outside.

The light emitting element 11 includes, for example, a semiconductor laser element such as LD (Laser Diode). The light emitting element 11 includes, for example, a gallium nitride (GaN)-based semiconductor material and emits, for example, blue light in a wavelength band of 500 nm or less or 470 nm or less, for example. A wavelength conversion member such as a fluorescent material may be disposed in the optical path of the light emitted from the light emitting element 11. The light emitting element 11 may include, for example, a semiconductor material such as a gallium arsenide (GaAs)-based material. One (e.g., anode) of the anode and the cathode of the light emitting element 11 is coupled to the wiring structure provided in the housing member 14 described below by wire bonding and extracted, for example, from an electrode extraction section 14E2. For example, a wire W is used in the wire bonding. The wire W includes, for example, gold (Au). One (e.g., cathode) of the anode and the cathode of the light emitting element 11 is extracted, for example, from an electrode extraction section 14E1 through the wiring structure provided in the housing member 14 without using the wire W, for example, in a case where the electrically conductive submount 12 described below is used.

The submount 12 is for mounting the light emitting element 11. The submount 12 is provided between the light emitting element 11 and the bottom surface of the recessed section 14C of the housing member 14. The submount 12 is, for example, a plate-shaped member. The position of the light emitting element 11 in the Z axis direction may be adjusted in accordance with the thickness of the submount 12 (size in the Z direction in FIGS. 1A and 1B). The submount 12 includes, for example, an insulating material such as aluminum nitride (AlN), silicon (Si), silicon carbide (SiC), diamond, or beryllium oxide (BeO). In a case where the submount 12 including an insulating material is used, a wire is coupled from a metal pattern (not illustrated) on the submount 12 to a metal pattern 143M1 or a metal pattern 141M1. This electrically couples, for example the electrode extraction section 14E1 and the light emitting element 11 (see FIG. 3 and FIGS. 4A to 4C).

The submount 12 may include, for example, an electrically conductive material such as copper tungsten (Cu—W), copper molybdenum (Cu—Mo), copper diamond, and graphite. The use of the electrically conductive submount 12 makes it possible to cause one (e.g., cathode) of the electrodes of the light emitting element 11 to be conducted to the wiring structure inside the housing member 14 through the submount 12. This decreases the wires W in number as compared with a case where the anode and the cathode of the light emitting element 11 are both coupled, for example, to an electrode extraction section 14E by using the wires W. It is thus possible to decrease the semiconductor device 10A in size.

The light emitting element 11 is eutectically bonded to the submount 12, for example, by AuSn (gold-tin) and the submount 12 is eutectically bonded to the bottom surface of the recessed section 14C of the housing member 14, for example, by AuSn. The submount 12 may also be bonded to the bottom surface of the recessed section 14C of the housing member 14, for example, by silver (Ag) paste, sintered gold (Au), sintered silver (Ag), or the like.

The mirror 13 is for reflecting the light emitted from the light emitting element 11. The light emitted from the light emitting element 11 is reflected by the mirror 13 and emitted from the cover 15 side. The mirror 13 is provided in the recessed section 14C of the housing member 14 along with the light emitting element 11 mounted on the submount 12. The recessed section 14C is provided, for example, with a step inside. The mirror 13 is disposed at a lower position than that of the light emitting element 11.

The mirror 13 has, for example, an inclined surface. This inclined surface is disposed to be opposed to the light emitting surface of the light emitting element 11. The inclined surface of the mirror 13 is inclined, for example, by 45° from the bottom surface of the housing member 14. This allows the light reflected by the inclined surface of the mirror 13 to be extracted in the direction vertical to the bottom surface of the housing member 14. Adjusting the angle of the inclined surface of the mirror 13 also allows the light extraction direction to be changed. The mirror 13 includes, for example, glass, synthetic quartz, silicon, sapphire, copper, aluminum, or the like. The inclined surface of the mirror 13 may be provided, for example, with a reflective film such as a metal film or a dielectric multilayered film. This reflective film has, for example, a reflectance of 90% or more for the light emitted from the light emitting element 11. The reflective film preferably has a reflectance of 99% or more.

FIG. 3 is an exploded perspective view of an example of a configuration of the housing member 14 illustrated in FIGS. 1A and 1B. FIGS. 4A to 4C schematically illustrate cross-sectional configurations of the housing member 14 taken along an II-II line, an line, and an IV-IV line illustrated in FIGS. 1A and 1B. The housing member 14 includes the recessed section 14C that houses the light emitting element 11 mounted on the submount 12 and the mirror 13, and seals these, along with the cover 15, with the metal patterns 14MC and 151M and the solder bonding section 16 interposed in between. In other words, the recessed section 14C of the housing member 14, the cover 15, the metal patterns 14MC and 151M, and the solder bonding section 16 form a housing space S having airtightness. The recessed section 14C has, for example, a rectangular planar shape. The housing member 14 includes, for example, glass or ceramic. The housing member 14 includes, for example, a sintered compact such as aluminum nitride (AlN), aluminum oxide (alumina), or silicon carbide (SiC).

The housing member 14 includes a first layer 141 and a second layer 142. The first layer 141 is included in the bottom surface of the recessed section 14C. The second layer 142 is included in the side surface of the recessed section 14C. The second layer 142 includes a bonding layer 144 and an intermediate layer 143. The bonding layer 144 is bonded to the cover. The intermediate layer 143 is disposed between the first layer 141 and the bonding layer 144. Metal patterns 141M, 143M, and 144M are each formed on the first layer 141 and the second layer 142 (specifically, the intermediate layer 143 and the bonding layer 144) and electrically coupled as appropriate. Each of the metal patterns 141M, 143M, and 144M includes, for example, gold (Au) or the like.

As described above, the first layer 141 is included in the bottom surface of the recessed section 14C. The first layer 141 is, for example, a plate member having a rectangular planar shape. The first layer 141 has an upper surface 141S1 and a lower surface 141S2 that are opposed to each other. This upper surface 141S1 is included in a portion of the bottom surface of the recessed section 14C. The lower surface 141S2 is included in a back surface 14S2 of the housing member 14. The upper surface 141S1 is provided with the metal pattern 141M1. The metal pattern 141M1 is used, for example, to mount the mirror 13. The metal pattern 141M1 is provided to partially correspond to an opening 143H, for example, in a plan (XY plane) view. The opening 143H is provided in the intermediate layer 143 described below. Specifically, the metal pattern 141M1 is provided to be exposed in the opening 143H. This allows the mirror 13 to efficiently dissipate heat. In addition, it is possible to facilitate solder bonding onto the mirror 13.

The lower surface 141S2 of the first layer 141 is provided with a metal pattern 141M2 for mounting on a base plate 31 described below (see FIG. 8). This metal pattern 141M2 also functions as a heat dissipation member and also allows the heat generated by the light emitting element 11 to be efficiently dissipated to the base plate 31. In other words, providing the metal pattern 141M2 on the back surface 14S2 of the housing member 14 makes it possible to electrically and thermally couple the semiconductor device 10A and the base plate 31.

As described above, the intermediate layer 143 is included in a portion of the side surface of the recessed section 14C and disposed between the first layer 141 and the bonding layer 144. The intermediate layer 143 is, for example, a plate member having a rectangular planar shape. The intermediate layer 143 has an upper surface 143S1 and a lower surface 143S2 that are opposed to each other. This upper surface 143S1 is included in the bottom surface of the recessed section 14C along with the upper surface 141S1 of the first layer 141. The intermediate layer 143 is provided with the opening 143H in which the mirror 13 is disposed. The metal pattern 141M1 provided on the upper surface of the first layer 141 is exposed in the opening 143H. The mirror 13 is mounted through the metal pattern 141M1.

The upper surface 143S1 of the intermediate layer 143 is provided with the metal pattern 143M1 and a metal pattern 143M2 that are independent from each other. The metal pattern 143M1 is used, for example, to mount the submount 12. The metal pattern 143M1 is patterned to overlap at least partially, for example, with at least any one of the metal pattern 141M1 provided on the first layer 141 or a metal pattern 144M1 provided on the bonding layer 144 described below in a plan view. In addition, the metal pattern 143M1 is provided to be partially exposed in an opening 144H provided in the bonding layer 144 and mounted with the submount 12. This allows the submount 12 to efficiently dissipate heat. In addition, it is possible to facilitate solder bonding onto the submount 12. The metal pattern 143M2 is patterned to at least partially overlap with a metal pattern 144M2 provided on the bonding layer 144, for example, in a plan view.

The intermediate layer 143 is further provided with a via V1 that penetrates the intermediate layer 143 in the Z axis direction. The via V1 is provided at the position overlapping with the metal pattern 143M1 and the metal pattern 141M1 on the first layer 141 and couples the metal pattern 141M1 and the metal pattern 143M1. Providing this via V1 facilitates electroplating treatment in gold plating treatment described below. In addition, providing the via V1 makes it possible to electrically couple, for example, the electrode extraction section 14E1 and the light emitting element 11 by coupling a wire from the metal pattern (not illustrated) on the submount 12 to the metal pattern 141M1 in a case where an insulating material is used for the submount 12.

As described above, the bonding layer 144 is included in a portion of the side surface of the recessed section 14C and bonded to the cover 15. The bonding layer 144 is, for example, a plate member having a rectangular planar shape. The bonding layer 144 has an upper surface 144S1 and a lower surface 144S2 that are opposed to each other. This upper surface 144S1 is included in the bonded surface 14S1 of the housing member 14 to the cover 15. The bonding layer 144 is provided with the opening 144H in which the submount 12 is disposed. Portions of the metal pattern 143M1 and the metal pattern 143M2 provided on the upper surface of the intermediate layer 143 are exposed in the opening 144H. The submount 12 is mounted through the metal pattern 143M1. The metal pattern 143M2 is electrically coupled to one (e.g., anode) of the electrodes of the light emitting element 11 mounted on the submount 12 through the wire W. In addition, the opening 144H includes the opening 143H provided in the intermediate layer 143. In other words, the recessed section 14C includes the opening 143H and the opening 144H. This causes the bottom surface of the recessed section 14C to have a step.

The upper surface 144S1 of the bonding layer 144 is provided with the metal pattern 144M1 that surrounds the opening 144H in a frame shape and partially protrudes to the outer side of the frame. This frame-shaped portion (metal pattern 14MC) is used as a solder base layer in bonding to the cover 15. The protruding portion (metal pattern 14ME) is exposed from the cover 15. The protruding portion (metal pattern 14ME) is included in the electrode extraction section 14E1 that electrically couples the light emitting element 11 and the outside. In other words, the metal pattern 144M1 includes the metal pattern 14MC and the metal pattern 14ME. The upper surface 144S1 of the bonding layer 144 is further provided with the metal pattern 144M2 independent from the metal pattern 144M1, for example, next to the protruding portion (metal pattern 14ME) of the metal pattern 144M1. The metal pattern 144M2 is exposed from the cover 15 along with the metal pattern 14ME. The metal pattern 144M2 is included in the electrode extraction section 14E2 that electrically couples the light emitting element 11 and the outside. The electrode extraction section 14E1 and the electrode extraction section 14E2 are portions where the electrodes are drawn out from the anode and the cathode of the light emitting element 11.

The bonding layer 144 is further provided, for example, with three vias V2 and one via V3 that penetrate the bonding layer 144 in the Z axis direction. The three vias V2 are provided at the positions overlapping with the metal pattern 144M1 and the metal pattern 143M1 on the intermediate layer 143. Specifically, the two vias V2 of the three vias V2 are provided immediately below the metal pattern 14MC and the one via V2 is provided immediately below the metal pattern 14ME. In other words, the metal pattern 14MC is coupled to the metal pattern 143M1 by the two vias V2 and the metal pattern 14ME is coupled to the metal pattern 143M1 by the one via V2. The one via V3 is provided at the position overlapping with the metal pattern 144M2 and the metal pattern 143M2 on the intermediate layer 143 and couples the metal pattern 143M2 and the metal pattern 144M2.

As described above, the anode and the cathode of the light emitting element 11 are drawn out from the electrode extraction section 14E1 and the electrode extraction section 14E2 exposed from the cover 15 through the metal patterns 141M, 143M, and 144M provided on the first layer 141 and the second layer 142 and the vias V1, V2, and V3. Specifically, the cathode of the light emitting element 11 is drawn out from the electrode extraction section 14E1, for example, through the metal pattern 141M1, the via V1, the metal pattern 143M1, and the one via V2 and the metal pattern 141M1, the via V1, the metal pattern 143M1, the two vias V2, and the metal pattern 14MC. The anode of the light emitting element 11 is drawn out from the electrode extraction section 14E2, for example, through the wire W, the metal pattern 143M2, and the via V3.

The metal pattern 14MC is a portion of the metal pattern 144M1. The metal pattern 144M1 includes the metal pattern 14ME included in the electrode extraction section 14E1 in addition to the metal pattern 14MC. In other words, the metal pattern 14MC and the metal pattern 14ME are formed in the same metal pattern (metal pattern 144M1) and electrically coupled to each other. In addition, the metal pattern 14MC is coupled to the metal pattern 143M1 through the two vias V2. The metal pattern 143M1 is electrically coupled, for example, to the cathode of the light emitting element 11, for example, through the submount 12. In other words, the metal pattern 14MC is included, for example, in a portion of the electrical conduction path between the cathode of the light emitting element 11 and the electrode extraction section 14E1, along with the metal pattern 151M and the solder bonding section 16 described below. This increases the cross-sectional area of the electrical conduction path that electrically couples the light emitting element 11 and the outside (e.g., electrode extraction section 14E1) and reduces the internal resistance.

It is to be noted that a surface coat film (not illustrated) that prevents spread of solder to the electrode extraction section 14E1 is preferably formed on the border between the metal pattern 14MC and the metal pattern 14ME that is used as the electrode extraction section 14E1. The surface coat film may be formed by using a dielectric material, for example. Specific examples of the dielectric material include aluminum nitride (AlN), aluminum oxide ($Al_2O_3$), silicon oxide ($SiO_2$), silicon nitride (SiN), and the like.

The light emitted from the light emitting element 11 is extracted from the cover 15. The cover 15 is, for example, a plate member having a rectangular planar shape. The cover 15 has an upper surface 15S1 and the lower surface 15S2 that are opposed to each other. The cover 15 covers at least the recessed section 14C of the housing member 14. The cover 15 includes a material that has light transmissivity at the portion covering at least the recessed section 14C. Specifically, the cover 15 includes, for example, glass or the like. On the lower surface 15S2 of the cover 15, the metal pattern 151M including chromium (Cr), nickel (Ni), gold (Au), titanium (Ti), or the like is formed. This metal pattern 151M is used as a solder base layer in bonding to the housing member 14, as with the metal pattern 14MC, and is included, for example, in a portion of the electrical conduction path between the cathode of the light emitting element 11 and the electrode extraction section 14E1. The metal pattern 151M has substantially the same planar shape, for example, as that of the bonding metal pattern 14MC portion formed on the bonded surface 14S1 of the housing member 14. Specifically, the metal pattern 151M has the shape of a frame that surrounds the recessed section 14C. The metal pattern 151M has substantially the same width as that of the bonding metal pattern 14MC formed on the upper surface of the housing member 14 or a width equal to or less than that of the bonding metal pattern 14MC.

The solder adsorption layer 152M that adsorbs excess solder when the housing member 14 and the cover 15 are bonded is further formed on the lower surface 15S2 of the cover 15. Specifically, on the inner side and the outer side with respect to the metal pattern 151M formed in a frame shape, the metal patterns 152M1 and 152M2 are formed respectively, apart from the metal pattern 151M. The metal patterns 152M1 and 152M2 may include, for example, chromium (Cr), nickel (Ni), gold (Au), titanium (Ti), or the like, as with the metal pattern 151M.

The metal pattern 152M1 is formed as a solid film, for example, on the inner side with respect to the metal pattern 151M. However, in the metal pattern 152M1, an opening 152H is formed at a position opposed to the light emitting element 11 to allow the light emitted from the light emitting element 11 to be extracted. This opening 152H is a "transmissive region" of the present disclosure. Adjusting the size of the opening 152H makes it possible to reduce extraction of stray light generated in the housing member 14. In addition, adjusting the shape of the opening 152H makes it possible to extract light with a desired shape. In other words, the metal pattern 152M1 may be used as an aperture.

A distance Wb1 between the metal pattern 152M1 and the metal pattern 151M is preferably 10 μm or more apart, for example. One reason for this is that, when solder is applied to 151M1, a positional deviation can cause the solder to be applied to the metal pattern 152M1. The upper limit is, for example, a width Wa of the metal pattern 151M. One reason for this is that, when the solder is applied to the metal pattern 151M1, a solder amount is proportional to a width of the metal pattern 151M1. If the distance Wb1 between the metal pattern 152M1 and the metal pattern 151M is larger than the width of the metal pattern 151M1, it is therefore likely that the solder squeezed out does not come into contact with the metal pattern 152M1.

The metal pattern 152M2 is formed in a frame shape, for example, as with the metal pattern 151M, on the outer side with respect to the metal pattern 151M. A distance Wb2 between the metal pattern 152M2 and the metal pattern 151M is preferably 10 μm or more apart, for example, and the upper limit is, for example, the width Wa of the metal pattern 151M, as with the distance Wb1 between the metal pattern 152M1 and the metal pattern 151M.

There is no particular upper limit for the area of the metal patterns 152M1 and 152M2. As the lower limit, the area of each of the metal pattern 152M1 and the metal pattern 152M2 is preferably, for example, 0.004% or more of the area of the metal pattern 151M. In the above way, it is possible to sufficiently adsorb the excess solder.

The solder bonding section 16 is for bonding the housing member 14 and the cover 15. The solder bonding section 16 is formed in a frame shape, as with the metal pattern 14MC and the metal pattern 151M each formed in a frame shape. For the solder bonding section 16, SnAgCu (tin-silver-copper)-based solder may be used, for example. In addition to these, any solder that allows for hermetic sealing may be used. For example, AuSn (gold-tin)-based solder, Sn (tin)-based solder, In (indium)-based solder, or the like may be used.

The semiconductor device 10A is manufactured, for example, as follows. Specifically, the metal pattern 141M and the metal pattern 141M2 are formed on the upper surface 141S1 and the lower surface 141S2 of the first layer 141. Next, the second layer 142 is formed. First, the opening 143H included in the recessed section 14C and a through hole (not illustrated) for the via V1 are formed in the intermediate layer 143. Subsequently, the via V1 is formed by filling the through hole, for example, with tungsten paste, copper (Cu), or silver (Ag) and the metal pattern 143M1 and the metal pattern 143M2 are then formed on the upper surface 143S1 of the intermediate layer 143. Next, the opening 144H included in the recessed section 14C and a through hole (not illustrated) for the vias V2 and V3 are formed in the bonding layer 144. Subsequently, the vias V2 and V3 are formed by filling the through hole, for example, with tungsten paste, copper (Cu), or silver (Ag) and the metal pattern 144M1 and the metal pattern 144M2 are then formed on the upper surface 144S1 of the bonding layer 144. Thereafter, sintering is performed, gold plating treatment is performed on the exposed portion, and singulation is then performed to form the housing member 14. Next, after the submount 12, the light emitting element 11, and the mirror 13 are disposed in the recessed section 14C of the housing member 14, for example, the anode of the light emitting element 11 and the metal pattern 143M2 are coupled by wire bonding. For example, a gold wire (wire W) is used in the wire bonding. In addition, in a case where an insulating material is used for the submount 12, a wire is coupled from a metal pattern (not illustrated) on the submount 12 to the metal pattern 143M1 or the metal pattern 141M1. This electrically couples, for example the electrode extraction section 14E1 and the light emitting element 11.

In the manufacturing process of the semiconductor device 10A described above, the melting temperature of bonding agents is of importance in the three steps of mounting the mirror 13, mounting the light emitting element 11 and the submount 12, and bonding the housing member 14 and the cover 15. For example, the mirror 13 is preferably bonded by using AuSn solder or sintering Ag paste as a bonding agent. The light emitting element 11 and the submount 12 are preferably bonded by using AuSn solder as a bonding agent. The housing member and the cover 15 are preferably bonded by using SnAgCu solder as a bonding agent. The combinations described above prevent the bonding agents from remelting in the respective steps, making it possible to secure the mounting accuracy.

It is to be noted that, in a case where AuSn solder is used to mount the mirror 13, the AuSn solder that melts in mounting the mirror 13 can take in, for example, the gold plating applied to the metal pattern exposed in the recessed section 14C of the housing member 14 and increase the melting temperature. It is possible to prevent this remelting by appropriately setting the melting temperature of the AuSn solder to mount the light emitting element 11 and the submount 12.

Subsequently, the cover 15 is bonded to the housing member 14. First, on the lower surface 15S2 of the cover 15, a Cr film is formed by vapor deposition or sputtering, for example, as the metal pattern 151M and the solder adsorption layer 152M. Subsequently, Ni plating or Au plating is applied, for example, to the Cr pattern. It is to be noted that, in place of the plating, the corresponding metal film may be formed by using vapor deposition or sputtering. Next, masking is performed on a region other than the metal pattern 151M, and solder paste 16S is applied, for example, onto the metal pattern 151M by screen printing, for example, as illustrated in FIG. 5A. Thereafter, heating is performed to melt the solder paste and remove an organic solvent included in the solder paste 16S. Thereafter, for example, the housing member 14 and the cover 15 are put together, as illustrated in FIG. 5B, and are heated at, for example, a temperature several tens of degrees higher than the melting temperature of solder. In this case, solder 16Sx squeezed out of the metal pattern 14MC and the metal pattern 151M is adsorbed on the metal patterns 152M1 and 152M2 formed on the inner side and the outer side of the metal pattern 151M. In the above way, the light emitting element 11 is hermetically sealed, and the semiconductor device 10A is completed.

It is to be noted that the solder paste 16S may be, for example, applied onto the metal pattern 14MC of the housing member 14, as illustrated in FIG. 6. Alternatively, solder foil 16F may be used for bonding between the housing member 14 and the cover 15, as illustrated in FIG. 7.

In the semiconductor device 10A, light is extracted, for example, as follows. The light (e.g., light in the blue wavelength band) emitted from the light emitting element 11 is reflected by the mirror 13, transmitted by the cover 15, and extracted from the semiconductor device 10A.

1-2. Configuration of Light Emitting Apparatus

FIG. 8 illustrates a schematic configuration of the side surface of a light emitting apparatus (light emitting apparatus 1) including the semiconductor device 10A illustrated in FIG. 1A. FIG. 9 is an exploded perspective view of the light emitting apparatus 1 illustrated in FIG. 8. The light emitting apparatus 1 includes the semiconductor device 10A, the base plate 31, a lens holding member 32, and an array lens 33. The array lens 33 includes a lens 331 corresponding to each of the semiconductor devices 10A.

The base plate 31 is a member for placing the semiconductor device 10A. The base plate 31 is, for example, a flat member. The base plate 31 has a front surface 31A and a back surface 31B that are opposed to each other. The front surface 31A is provided with the plurality of semiconductor devices 10A and the back surface 31B is thermally coupled, for example, to a heat sink or the like (not illustrated).

The base plate 31 includes, for example, a ceramic material, a metal material, or the like. The base plate 31 including a metal material is able to increase heat dissipation. Examples of the metal material include iron (Fe), iron alloy, copper (Cu), aluminum (Al), copper alloy, and the like. Examples of the copper alloy include copper-tungsten (CuW) and the like. Examples of the ceramic material include aluminum nitride (AlN) and the like. The base plate 31 may be provided with a coolant channel.

The base plate 31 may be provided with a recessed section for placing the semiconductor device 10A. Providing the semiconductor device 10A in the recessed section of the base plate 31 allows the semiconductor device 10A to be protected.

The plurality of semiconductor devices 10A is placed on the front surface 31A of the base plate 31. The plurality of semiconductor devices 10A is disposed, for example, in a matrix on the front surface 31A of the base plate 31 (in the X direction and the Y direction of FIG. 9). For example, a portion of the semiconductor devices 10A disposed in a matrix may be missing. This missing portion of the semiconductor devices 10A is, for example, for the purpose of removing a defective product or the purpose of reducing a portion of the power density in the surface. The semiconductor devices 10A may be disposed, for example, in another form such as a substantially hexagonal shape or a houndstooth shape.

The intervals between the plurality of semiconductor devices 10A disposed in a matrix on the front surface 31A of the base plate 31 are smaller, for example, in the θ-parallel direction than in the θ-perpendicular direction. The FFP (Far Field Pattern) half-value width in the θ-parallel direction is narrower than the FFP half-value width in the θ-perpendicular direction. It is thus possible to decrease the intervals between the semiconductor devices 10A in the θ-parallel direction. This makes it possible to increase the light density. The plurality of semiconductor devices 10A may be disposed in a line.

The lens holding member 32 provided between the base plate 31 and the array lens 33 has, for example, the shape of a frame that surrounds the plurality of semiconductor devices 10A placed on the front surface 31A of the base plate 31 (FIG. 9). In other words, the plurality of semiconductor devices 10A is provided on the inner side of the frame-shaped lens holding member 32. The planar shape of the lens holding member 32 is, for example, a quadrangular shape. This lens holding member 32 includes, for example, a holding section 321 having a quadrangular frame shape and an expanded section 322 expanded on the inner side and the outer side of the holding section 321. The expanded section 322 is provided, for example, on two opposed sides of the quadrangular holding section 321. The lens holding member 32 does not have to be provided over the entire circumference of the base plate 31, but may be provided, for example, on three sides of the quadrangular base plate 31. Alternatively, the lens holding member 32 may be provided on two opposed sides of the quadrangular base plate 31.

The lens holding member 32 is fixed to the base plate 31 by using, for example, a screw or the like (not illustrated). A method of fixing the lens holding member 32 to the base plate 31 may be any method. For example, adhesive may be used to fix the lens holding member 32 to the base plate 31. The adhesive includes, for example, a resin material. Alternatively, the lens holding member 32 and the base plate 31 may be collectively molded by using an insert molding process or the like.

The thickness of the holding section 321 (size in the Z direction in FIG. 9) is, for example, greater than the thickness of the expanded section 322. This holding section 321 is in contact with the base plate 31 and the array lens 33. The distance between each of the semiconductor devices 10A and the lens 331 is thus adjusted in accordance with the thickness of the holding section 321. The thickness of the holding section 321 is preferably large enough to maintain spaces between the cover 15 and the array lens 33 and between the base plate 31 and the array lens 33. The spaces are large enough to allow gas to flow. The size of a space that is large enough to allow gas to flow is, for example, about 0.01 mm. This is a machining tolerance. Alternatively, the size of a space that is large enough to allow gas to flow is about 0.5 mm. This is a tolerance in resin molding. In a case where the cover 15 and the array lens 33 are too close to each other, a desorbed matter caused by adhesive or the like stays in between. In a case where this desorbed matter reacts with light and is adsorbed on the cover 15 or the array lens 33, the optical characteristics are decreased. Providing a space that is large enough to allow gas to flow between the cover 15 and the array lens 33 makes it possible to suppress such a decrease in the optical characteristics. The holding section 321 has a thickness of about 1 mm to 30 mm, for example. It is sufficient if the thickness of the holding section 321 is adjusted, for example, in accordance with the focal distance of the lens 331, the optical path length in the semiconductor device 10A, and the like. The holding section 321 includes, for example, a resin material.

The expanded section 322 is provided, for example, with a terminal section 322E. This terminal section 322E is for electrically coupling the semiconductor device 10A (light emitting element 11) to the outside, for example, through a wiring line WA. The plurality of terminal sections 322E is provided from the inner side to the outer side of the expanded section 322. The terminal section 322E includes, for example, an electrically conductive metal material such as aluminum (Al). The portion of the expanded section 322 other than the terminal section 322E includes, for example, the same resin material as that of the holding section 321. The expanded section 322 and the holding section 321 may include different resin materials.

The holding section 321 and the expanded section 322 may be individually fixed to the base plate 31. In addition, in a case of the holding section 321 and the expanded section 322, the holding section 321 may be fixed to the expanded section 322. For example, the holding section 321 includes resin or metal. The expanded section 322 and the terminal section 322E each include PCB (Printed Circuit Board). This allows the holding section 321 to adhere to the base plate 31 or the expanded section 322 by using UV adhesive or solder. In addition, the array lens 33 and the holding section 321 may be collectively molded by using an insert molding method. The lens holding member 32 may include a metal material such as aluminum (Al), SUS (Steel Use Stainless), iron (Fe), and copper (Cu). Alternatively, the lens holding member 32 may include a ceramic material or the like. The shape of the lens holding member 32 may be formed by machining such as cutting or formed by die casting, sintering, or the like. The lens holding member 32 including the terminal section 322E preferably includes, for example, one component that is integrated by collective molding. This makes it possible to suppress the cost.

The array lens 33 is opposed to the base plate 31 with the plurality of semiconductor devices 10A interposed in between. This array lens 33 includes, for example, an array section 33A in the middle portion and a frame section 33F surrounding this array section 33A. In the array section 33A, the plurality of lenses 331 is provided at positions opposed to the respective semiconductor devices 10A. Each of the lenses 331 is disposed, for example, at a position overlapping with the light emitting element 11 and the mirror 13 in a plan view. The lens 331 includes, for example, a convex lens. The lens 331 may include a plano-convex lens, a biconvex lens, a meniscus lens, and the like. The light transmitted by the cover 15 of each of the semiconductor devices 10A is collimated by passing through the lens 331. The array lens 33 may have configurations that are different between the lower surface (e.g., the surface opposed to the base plate 31) side and the upper surface side. For example, one of the surface sides of the array lens 33 may have a FAC (Fast Axis Collimator) function and the other surface side may have a SAC (Slow Axis Collimator) function. The array lens 33 then has, for example, lenticular lenses disposed in the direction in which the lenticular lenses are orthogonal to each other. The array lens 33 includes, for example, one lens having a biconvex shape or two plano-convex lenses integrally bonded together on the flat surfaces. Alternatively, the array lens 33 includes two plano-convex lenses that have the flat surface sides aligned to point to the semiconductor device 10A side and are held and integrated by the frame section 33F of the array lens 33.

The frame section 33F around the array section 33A has, for example, a quadrangular planar shape. This frame section 33F is fixed to the holding section 321 of the lens holding member 32, for example, with adhesive or the like (not illustrated). It is possible to use a photocurable resin such as a UV (Ultra Violet) curable resin or the like as this adhesive. The shrinkage of the resin by photocuring facilitates the array lens 33 and the lens holding member 32 to have a positional deviation in between. It is thus preferable to use, for example, a resin material having a curing shrinkage amount of about several % or less. It is more preferable to use a resin material having a curing shrinkage amount of 1% or less. The array lens 33 may be fixed to the lens holding member 32, for example, by a screw or the like. Alternatively, the array lens 33 and the lens holding member 32 may be collectively molded by an insert molding process or the like. As described above, the spaces that are large enough to allow gas to flow are provided between the array section 33A and the base plate 31 and between the array section 33A and the semiconductor device 10A. The array lens 33 includes, for example, borosilicate glass or the like.

FIG. 10 illustrates the semiconductor device 10A illustrated in FIGS. 1A and 1B along with the terminal section 322E of the lens holding member 32. The electrode extraction section 14E1 and the electrode extraction section 14E2 provided on the upper surface of each of the plurality of semiconductor devices 10A are coupled to each other, for example, through a wire (wiring line WA). The electrode extraction section 14E2 of the semiconductor device 10A disposed at the position that is the closest to the terminal section 322E of the lens holding member 32 is coupled to the terminal section 322E through the wiring line WA. This makes it possible to couple the outside and the light emitting element 11 of the semiconductor device 10A. It is to be noted that FIG. 10 omits the cover 15.

In addition, the metal patterns 141M2 provided on the back surfaces (the back surfaces 14S2 of the housing members 14) of the adjacent semiconductor devices 10A may be continuous, for example, with silver paste interposed in between. This thermally couples the metal patterns 141M2 of the adjacent semiconductor devices 10A and widens the heat dissipating path.

In the light emitting apparatus 1, light is extracted, for example, as follows. The light extracted from each of the semiconductor devices 10A placed on the base plate 31 passes, for example, through the lens 331 at the position corresponding to the semiconductor device 10A to be collimated light. The pieces of light passing through the respective lenses 331 thus travel in parallel to each other and are extracted from the light emitting apparatus 1.

1-3. Workings and Effects

In the semiconductor device 10A according to the present embodiment, the solder adsorption layer 152M is formed at the position apart from the metal pattern 151M serving as the base layer for the solder bonding section 16 that bonds the housing member 14 and the cover 15. Specifically, the metal pattern 152M1 is provided on the inner side with respect to the metal pattern 151M, and the metal pattern 152M2 is provided on the outer side with respect to the metal pattern 151M. Thus, the solder 16Sx squeezed out of the metal pattern 14MC and the metal pattern 151M in bonding is adsorbed on the metal pattern 152M1 and the metal pattern 152M2. This makes it possible to prevent solder dripping into the housing space S and to the outer side of the housing member 14. The following describes this.

Driving a semiconductor device including a semiconductor laser element causes the siloxane in the atmosphere to react with light near a light emitting point and a reactant tends to be deposited on an end surface of the light emitting element. This reactant causes a change in the reflectance of the end surface. This can cause a decrease in the optical characteristics and destroy the light emitting element. Especially a blue semiconductor laser element that emits, for example, a short wavelength of 470 nm or less tends to have a defect caused by this siloxane in the atmosphere. A technique is therefore used that suppresses the occurrence of this defect caused by the siloxane in the atmosphere by hermetically sealing the semiconductor laser element or the like in a package.

In general, solder is used for hermetic sealing of a light emitting element in a package. For example, in a case where a package member 1011 and a lid member 1012 are bonded by using solder, as illustrated in FIG. 11A, metal films 1011M and 1012M are provided as bases at positions opposed to each other of the corresponding bonded surfaces. Pasty solder 1022S is applied, for example, to the metal film 1012M on the lid member 1012 side. Thereafter, heating is performed to melt the solder paste and remove the organic solvent included in the solder paste 16S. Thereafter, bonded surfaces 1011S and 1012S are disposed to face each other, and bonding is performed by melting the solder 1022S by heating. In this case, if pressing force from the lid member 1012 side causes the package member 1011 and the lid member 1012 to come into contact with each other, as illustrated in FIG. 11B, the solder 1022S spills over to the inner side and the outer side of the package member 1011, causing solder dripping.

If the solder 1022S that has spilled over inside the package member 1011 comes into contact with a wire or the like that couples the light emitting element and an electrode, for example, this can cause a characteristic defect, such as occurrence of an electrical short circuit. On the other hand, reducing the solder amount to prevent solder dripping causes a decrease in the airtightness inside the package.

In addition to this, a conceivable method is to adjust the mounting height of the lid member 1012 in bonding by a manufacturing facility, but this can greatly increase the cost. In addition, the package member 1011 and the lid member 1012 have shape variations between products, and therefore have to be subjected to height adjustment individually, which can complicate the manufacturing process.

In contrast, in the present embodiment, on the inner side and the outer side of the metal pattern 151M formed on the lower surface 15S2 of the cover 15 and serving as the base layer for the solder bonding section 16, the metal patterns 152M1 and 152M2 apart from the metal pattern 151M are respectively provided, and these are used as the solder adsorption layer 152M. This allows the solder 16Sx squeezed out of the metal pattern 14MC and the metal pattern 151M in bonding to be adsorbed on the metal pattern 152M1 and the metal pattern 152M2.

In the above way, in the semiconductor device 10A according to the present embodiment, it is possible to prevent occurrence of solder dripping into the housing space S that houses the light emitting element 11 or the like and to the outer side of the housing member 14, and drop-off of solder. This makes it possible to prevent occurrence of a short circuit due to contact between a solder drip and, for example, the wire W that electrically couples the light emitting element 11 and the wiring structure provided in the housing member 14, or the like. In addition, it is possible to improve manufacturing yield.

In addition, in the present embodiment, the metal pattern 151M, and the metal pattern 152M1 and the metal pattern 152M2 are formed apart from each other. This allows solder to be adsorbed on the metal patterns 152M1 and 152M2 only in a case where the solder is excessive. This makes it possible to secure the solder amount necessary for bonding between the housing member 14 and the cover 15. This allows the semiconductor device 10A having high reliability to be provided.

The following describes a second embodiment, modification examples 1 to 14, and an application example. The following description, however, denotes the same components as those of the first embodiment described above by the same signs and descriptions thereof are omitted as appropriate.

2. Modification Examples 2-1. Modification Example 1

FIG. 12 is a plane schematic diagram for describing a configuration of a semiconductor device (semiconductor device 10B) according to the modification example 1 of the present disclosure. The semiconductor device 10B is a packaged surface mount device (SMD), as with the semiconductor device 10A in the first embodiment described above. The semiconductor device 10B according to the present modification example is different from that of the first embodiment described above in that the metal pattern 152M1 formed on the inner side with respect to the metal pattern 151M is formed in a frame shape.

In this way, the metal pattern 152M1 on the inner side with respect to the metal pattern 151M1 does not necessarily have to cover a wide range of the lower surface 15S2 on the inner side of the metal pattern 151M1. By forming the metal pattern 152M1 in a frame shape as in the present modification example, it is possible to check an internal component, such as the light emitting element 11, housed in the housing space S after bonding, in addition to the effects of the first embodiment described above.

2-2. Modification Example 2

FIG. 13 is a plane schematic diagram for describing a configuration of a semiconductor device (semiconductor device 10C) according to the modification example 2 of the present disclosure. The semiconductor device 10C is a packaged surface mount device (SMD), as with the semiconductor device 10A in the first embodiment described above. The semiconductor device 10C according to the present modification example is different from that of the first embodiment described above in that the metal pattern 152M1 formed on the inner side with respect to the metal pattern 151M is formed doubly in a frame shape.

The solder adsorption layer 152 of the present modification example includes, on the inner side with respect to the metal pattern 151M, frame-shaped metal patterns 152M1A and 152M1B that are provided in order from the metal pattern 151M side. The metal pattern 152M1A and the metal pattern 152M1B are, for example, formed apart from each other.

In this way, doubly forming the metal patterns 152M1A and 152M1B as the solder adsorption layer 152M on the inner side with respect to the metal pattern 151M1 enables, for example, the metal pattern 152M1B to adsorb solder squeezed out beyond the metal pattern 152M1A. This makes it possible to further reduce occurrence of solder dripping.

It is to be noted that the present modification example describes the example in which the double metal pattern is formed on the inner side of the metal pattern 152M1, but a triple metal pattern or a quadruple or more metal pattern may be formed.

2-3. Modification Example 3

FIG. 14 is a plane schematic diagram for describing a configuration of a semiconductor device (semiconductor device 10D) according to the modification example 3 of the present disclosure. The semiconductor device 10D is a packaged surface mount device (SMD), as with the semiconductor device 10A in the first embodiment described above. The semiconductor device 10D according to the present modification example is different from that of the first embodiment described above in that the metal patterns 152M1 and 152M2 included in the solder adsorption layer 152M are formed in a plurality of island shapes.

The metal pattern 152M1 and the metal pattern 152M2 are each formed in a plurality of island shapes apart from each other. The intervals between the island-shaped patterns are preferably, for example, 10 μm or more. In addition, in a case where the metal pattern 152M1 and the metal pattern 152M2 are formed in a plurality of island shapes, the island-shaped metal pattern 152M1 and the island-shaped metal pattern 152M2 preferably occupy, for example, 0.004% or more of an area of solder that is applied.

In this way, forming the metal patterns 152M1 and 152M2 included in the solder adsorption layer 152 in a plurality of island shapes makes it possible to prevent solder from being excessively adsorbed on the solder adsorption layer 152. This allows the semiconductor device 10D with further improved reliability to be provided.

In addition, in the present modification example, by forming the metal patterns 152M1 and 152M2 included in the solder adsorption layer 152 in a plurality of island shapes, it is possible to use these as patterns for image recognition when the light emitting element 11, the submount 12, the mirror 13, and the like are mounted and when the housing member 14 and the cover 15 are bonded. This allows each component to be accurately mounted.

2-4. Modification Example 4

FIG. 15A schematically illustrates a planar configuration of the cover 15, which is a main portion of a semiconductor device (semiconductor device 10E) according to the modification example 4 of the present disclosure. In the first embodiment described above, the metal patterns 152M1 and 152M2 are provided as the solder adsorption layer 152M on both the inner side and the outer side of the metal pattern 151M. However, for example, in a case where solder dripping is not likely to occur on the outer side, the solder adsorption layer 152M may be provided only on the inner side of the metal pattern 151M, as illustrated in FIG. 15A.

In addition, in that case, the shape of the solder adsorption layer 152M may be a frame shape (FIG. 15B) or a plurality of island shapes (FIG. 15C), as in the modification example 1 or the modification example 3 described above.

In this way, forming the solder adsorption layer 152M only on the inner side of the metal pattern 151M makes an area for providing the solder adsorption layer 152 on the outer side unnecessary. This allows for miniaturization of the cover 15, in addition to the effects of the first embodiment described above.

2-5. Modification Example 5

FIG. 16A schematically illustrates a planar configuration of the cover 15, which is a main portion of a semiconductor device (semiconductor device 10F) according to the modification example 5 of the present disclosure. In the first embodiment described above, the metal patterns 152M1 and 152M2 are provided as the solder adsorption layer 152M on both the inner side and the outer side of the metal pattern 151M. However, for example, in a case where solder dripping is not likely to occur on the inner side, the solder adsorption layer 152M may be provided only on the outer side of the metal pattern 151M, as illustrated in FIG. 16A.

In addition, in that case, the shape of the solder adsorption layer 152M may be a plurality of island shapes (FIG. 16B), as in the modification example 3 described above.

2-6. Modification Example 6

FIG. 17A schematically illustrates a planar configuration of the cover 15, which is a main portion of a semiconductor device (semiconductor device 10G) according to the modification example 6 of the present disclosure. FIG. 15C of the modification example 4 described above illustrates an example in which the solder adsorption layer 152M in a plurality of island shapes is provided only on the inner side of the metal pattern 151M. In that case, a metal pattern 152Mx may be enlarged, i.e., a widened section may be formed, at a corner, as illustrated in FIG. 17A.

In a case where the solder bonding section 16 is formed in a polygonal shape (a substantially rectangular shape in the present embodiment) as in the first embodiment described above, solder is concentrated at the corner, which makes solder dripping likely to occur at the corner. Therefore, enlarging the area of the metal pattern 152Mx at the corner, as in the present modification example, makes it possible to reduce occurrence of solder dripping at the corner.

In addition, in a case where the solder amount is small and it is possible to judge that solder dripping is likely to occur only at the corner, for example, the solder adsorption layer 152M may be formed only at the corner, as illustrated in FIG. 17B.

2-7. Modification Example 7

FIG. 18A is a plane schematic diagram for describing a configuration of a semiconductor device (semiconductor device 10H) according to the modification example 7 of the present disclosure. It is to be noted that FIG. 18A omits the electrode extraction section 14E. The same applies to the modification examples 8 and 9 described below. FIG. 18B schematically illustrates an example of a cross-sectional configuration of a main portion of the semiconductor device 10H taken along a V-V line illustrated in FIG. 18A. FIG.

18C schematically illustrates another example of the cross-sectional configuration of the main portion of the semiconductor device 10H taken along the V-V line illustrated in FIG. 18A. The semiconductor device 10H is a packaged surface mount device (SMD), as with the semiconductor device 10A in the first embodiment described above. The semiconductor device 10H according to the present modification example is different from that of the first embodiment described above in that a solder adsorption layer 145M is provided on the housing member 14 side.

The solder adsorption layer 145M includes, for example, metal patterns 145M1 and 145M2 each formed in a frame shape, for example, respectively on the inner side and the outer side with respect to the metal pattern 14MC formed in a frame shape, as illustrated in FIG. 18B. The metal patterns 145M1 and 145M2 are formed apart from the metal pattern 14MC used as the base layer, as with the metal patterns 152M1 and 152M2 in the first embodiment described above.

The metal pattern 145M1 on the inner side with respect to the metal pattern 14MC may, for example, partially extend onto the side surface of the recessed section 14C of the housing member 14, as illustrated in FIG. 18C. In addition, FIG. 18A illustrates an example in which the metal patterns 145M1 and 145M2 each continuous in a frame shape are formed on the inner side and the outer side of the metal pattern 14MC, but this is not limitative. For example, the metal patterns 145M1 and 145M2 may be formed in a plurality of island shapes, as in the modification example 3 described above. This makes it possible to prevent solder from being excessively adsorbed on the solder adsorption layer 145M. In addition, the solder adsorption layer 145M does not necessarily have to be formed on both the inner side and the outer side of the metal pattern 14MC. For example, the solder adsorption layer 145M may be formed only on the inner side of the metal pattern 14MC, as in the modification example 4 described above, or may be formed only on the outer side of the metal pattern 14MC, as in the modification example 5 described above. This allows for miniaturization of the housing member 14.

In this way, it is possible to achieve effects similar to those of the first embodiment described above, even in a case where the solder adsorption layer 145M is formed on the housing member 14 side.

2-8. Modification Example 8

FIG. 19A is a plane schematic diagram for describing a configuration of a semiconductor device (semiconductor device 100 according to the modification example 8 of the present disclosure. FIG. 19B schematically illustrates an example of a cross-sectional configuration of a main portion of the semiconductor device 10H taken along a VI-VI line illustrated in FIG. 19A. In this way, the solder adsorption layers 145M and 152M may be formed respectively on the housing member 14 side and the cover 15 side. It is to be noted that the patterns of the solder adsorption layers 145M and 152M illustrated in FIG. 19A are an example. The patterns described in the modification examples 1 to 6 described above may be combined as appropriate.

2-9. Modification Example 9

FIG. 20A is a plane schematic diagram for describing a configuration of a semiconductor device (semiconductor device 10J) according to the modification example 9 of the present disclosure. FIG. 20B schematically illustrates an example of a cross-sectional configuration of a main portion of the semiconductor device 10J taken along a VII-VII line illustrated in FIG. 20A. The first embodiment or the like described above describes the example in which the recessed section 14C that houses the light emitting element 11 or the like is formed on the housing member 14 side, but a recessed section 15C may be provided on the cover 15 side to cover the light emitting element 11 or the like, as illustrated in FIGS. 20A and 20B. In that case, the solder adsorption layer may be provided on the bonded surface 14S1 of the housing member 14, as illustrated in FIG. 20B, or may be provided on the lower surface 15S2 of the cover 15, which is bonded to the bonded surface 14S1.

2-10. Modification Example 10

FIG. 21 schematically illustrates an example of a cross-sectional configuration of a main portion of a semiconductor device (semiconductor device 10K) according to the modification example 10 of the present disclosure. FIG. 21 illustrates a cross section of the semiconductor device 10K taken along, for example, the I-I line, as with FIG. 1B in the first embodiment described above. The first embodiment described above, the modification example 9 described above, and the like describe, as an example, the housing member 14 and the cover 15, one of which has a shape including a recessed section that houses the light emitting element 11 or the like, and the other has a flat shape. However, the shapes of the housing member 14 and the cover 15 are not limited thereto. For example, the housing member 14 and the cover 15 may respectively have shapes including the recessed sections 14C and 15C, as illustrated in FIG. 21. In that case, the solder adsorption layer may be provided on both the housing member 14 side and the cover 15 side, as illustrated in FIG. 21, or may be formed on either one of the housing member 14 and the cover 15.

2-11. Modification Example 11

FIG. 22 schematically illustrates an example of a cross-sectional configuration of a semiconductor device (semiconductor device 10L) according to the modification example 11 of the present disclosure. As the light emitting element, for example, a vertical resonator surface emitting laser may be used as with a light emitting element 51 illustrated in FIG. 22. It is to be noted that, although not illustrated, a metal pattern 141M1A and a metal pattern 142M1 are electrically coupled through a via, and a metal pattern 141M1B and a metal pattern 142M2 are electrically coupled through a via.

Further, the semiconductor device 10L may be provided with a lens 153 on the upper surface 15S1 side of the cover 15 as illustrated in FIG. 23. This makes it possible to control the angle of radiation of the light emitted from the light emitting element 51. It is to be noted that the lens 153 may also be provided on the lower surface 15S2 side of the cover 15. Alternatively, the lenses 153 may be provided on both the upper surface 15S1 side and the lower surface 15S2 side of the cover 15. However, as illustrated in FIG. 18, providing the lens 153 on the upper surface 15S1 side of the cover 15 allows for miniaturization as compared with the lens 153 provided on the lower surface 15S2 side of the cover 15.

In addition, the semiconductor device 10L may be provided with a diffraction element 154 on the upper surface 15S1 side of the cover 15 as illustrated in FIG. 24. Providing the diffraction element 154 makes it possible to convert the light emitted from the light emitting element 51 into a desired output such as a random dot pattern.

3. Second Embodiment

FIG. 25A is a plane schematic diagram for describing a configuration of a semiconductor device (semiconductor device 10M) according to the second embodiment of the present disclosure. FIG. 25B schematically illustrates an example of a cross-sectional configuration of a main portion of the semiconductor device 10M taken along a VIII-VIII line illustrated in FIG. 25A. The semiconductor device 10M is a packaged surface mount device (SMD), as with the semiconductor device 10A in the first embodiment described above. In the semiconductor device 10M according to the present embodiment, the metal pattern 151M is provided on, for example, the entire lower surface 15S2 of the cover 15, and a solder diffusion prevention layer 155 having different solder wettability from the metal pattern 151M is formed at a predetermined position. This solder diffusion prevention layer 155 corresponds to a specific example of a "solder diffusion prevention layer" of the present disclosure.

In the present embodiment, the metal pattern 151M is provided, for example, over the entire lower surface 15S2 of the cover 15, and an opening 151H is formed at a position opposed to the light emitting element 11. The solder diffusion prevention layer 155 is formed in a frame shape, for example, on each of an inner edge and an outer edge of a region, on the metal pattern 151M, that is opposed to the metal pattern 14MC provided on the bonded surface 14S1 of the housing member 14. Specifically, a solder diffusion prevention layer 155A is formed on the inner edge of the region opposed to the metal pattern 14MC, and a solder diffusion prevention layer 155B is formed on the outer edge of the region opposed to the metal pattern 14MC.

Widths Wc1 and Wc2 of the solder diffusion prevention layers 155A and 155B are each preferably, for example, 10 μm or more, as with the above-described distances Wb1 and Wb2 between the metal pattern 151M and the metal pattern 152M1 and the metal pattern 152M2. The upper limit is, for example, the width Wa of the metal pattern 151M.

The solder diffusion prevention layer 155 (155A, 155B) may be, for example, formed by using a dielectric material. Specific examples of the dielectric material include aluminum nitride (AlN), aluminum oxide (Al$_2$O$_3$), silicon oxide (SiO$_2$), silicon nitride (SiN), and the like.

As described above, in the present embodiment, the solder diffusion prevention layers 155A and 155B are provided respectively on the inner edge and the outer edge of the metal pattern 151M formed on the lower surface 15S2 of the cover 15 and serving as the base layer for the solder bonding section 16. This allows the solder 16Sx squeezed out of the metal pattern 14MC and the metal pattern 151M to be adsorbed on the metal pattern 151M1 on the outer sides of the solder diffusion prevention layers 155A and 155B, as illustrated in FIG. 25B, while securing the solder amount necessary for bonding between the housing member 14 and the cover 15. Consequently, it is possible to prevent occurrence of solder dripping into the housing space S that houses the light emitting element 11 or the like and drop-off of solder. This makes it possible to prevent occurrence of a short circuit due to contact between a solder drip and, for example, the wire W, or the like. In addition, it is possible to improve manufacturing yield. In other words, it is possible to provide the semiconductor device 10M having high reliability.

4. Modification Examples

4-1. Modification Example 12

FIG. 26A schematically illustrates a planar configuration of a semiconductor device (semiconductor device 10N) according to the modification example 12 of the present disclosure. FIG. 26B schematically illustrates an example of a cross-sectional configuration of the semiconductor device 10N taken along an IX-IX line illustrated in FIG. 26A. The first embodiment, the second embodiment, and the like described above describe an example in which the light emitting element 11 is used as the semiconductor element, but this is not limitative. For example, a discrete semiconductor 61 illustrated in FIGS. 26A and 26B may be used. Further, for example, an electronic component, such as a sensor element, an integrated circuit (IC), and a hybrid IC, may be used.

It is to be noted that, in a case where it is unnecessary for the cover 15 to have light transmissivity, as with the discrete semiconductor 61, for example, the metal pattern 152M1 in the first embodiment described above may be formed on the entire lower surface 15S2 on the inner side with respect to the metal pattern 151M. In addition, the metal pattern 151M in the second embodiment described above may be formed on the entire lower surface 15S2. Further, a sintered compact such as aluminum nitride (AlN), aluminum oxide (alumina), or silicon carbide (SiC), a metal plate, or the like may be used for the cover 15.

4-2. Modification Example 13

FIG. 27 is a schematic exploded perspective view of a main portion of a light emitting apparatus (light emitting apparatus 2) according to a modification example 13 of the present disclosure. This light emitting apparatus 2 includes the base plate 31, the semiconductor device (e.g., semiconductor device 10A), and the array lens 33 in this order. In other words, the light emitting apparatus 2 is not provided with the lens holding member (e.g., lens holding member 32 in FIG. 8). The base plate 31 of the light emitting apparatus 2 includes, for example, a plate section 311, a holding section 312, and a terminal section 313E. Except for this point, the light emitting apparatus 2 according to the present modification example has a configuration similar to that of the light emitting apparatus 1 according to the first embodiment described above. The light emitting apparatus 2 according to the present modification example also has similar workings and effects.

The plate section 311 of the base plate 31 is, for example, a plate member having a quadrangular planar shape. The plurality of semiconductor devices 10A is placed on this plate section 311, for example, in a matrix.

The holding section 312 has the planar shape of a quadrangular frame that surrounds the plurality of semiconductor devices 10A disposed in the middle portion of the plate section 311. The holding section 312 is in contact with the plate section 311 and the array lens 33 (frame section 33F). The distance between each of the semiconductor devices 10A and the lens 331 is adjusted in accordance with the thickness of the holding section 312.

The terminal section 313E has, for example, the planar shape of a band that extends in one direction (Y direction in FIG. 27). The terminal section 313E is provided on the plate section 311. This terminal section 313E extends from the inner side to the outer side of the holding section 312. The electrode extraction sections 14E1 and 14E2 of the semiconductor device 10A are electrically coupled to this terminal section 313E. This electrically couples the light emitting element 11 to the outside.

The plate section 311, the holding section 312, and the terminal section 313E are, for example, integrated. The plate section 311 includes, for example, aluminum. The holding section 312 includes, for example, PEEK (polyether ether ketone). The terminal section 313E includes a metal material. The plate section 311 and the holding section 312 are collectively molded, for example, by insert-injection molding or the like. The plate section 311 may include, for example, aluminum (Al), copper (Cu), copper tungsten (Cu—W), aluminum nitride (AlN), or the like. The holding section 312 may include, for example, alumina, aluminum nitride, Kovar, or the like. In this case, the plate section 311 and the holding section 312 are insulated from the terminal section 313E, for example, by low-melting glass or the like.

4-3. Modification Example 14

The plurality of respective semiconductor devices 10A (light emitting elements 11) placed on the base plate 31 may emit pieces of light in a plurality of wavelength bands. The plurality of semiconductor devices 10A placed on the base plate 31 may include, for example, the semiconductor device 10A including the light emitting element 11 that emits light in the red wavelength band, the semiconductor device 10A including the light emitting element 11 that emits light in the blue wavelength band, and the semiconductor device 10A including the light emitting element 11 that emits light in the green wavelength band. The ratio and disposition of the semiconductor devices 10A of the respective colors are adjusted on the basis of a luminosity curve and an output (mW and lm). This makes it possible to extract white light from the light emitting apparatus 1. In this case, for example, the light emitting apparatus 1 includes a diffuser panel or the like. The light emitted from the semiconductor device 10A passes through the lens 331 and the diffuser panel or the like.

In this way, it is possible to easily place, on the base plate 31, the semiconductor devices 10A (light emitting elements 11) that emit pieces of light in wavelength bands different from each other at a desired ratio and in desired disposition. Therefore, it is possible to easily adjust the entire optical balance.

The light emitting element 11 may also include LED (Light Emitting Diode) or the like. However, in the light emitting element 11 including a semiconductor laser element, it is possible to further increase the light intensity and recognize light at a more distant position as compared with the light emitting element 11 including LED.

5. Application Example

The light emitting apparatuses 1 and 2 described in the first embodiment and the modification example 13 described above are applicable, for example, to a projection display.

FIG. 28 is a diagram illustrating a configuration example of a projection display (projection display 200) to which the light emitting apparatuses 1 and 2 are applied as light sources. This projection display 200 is, for example, a display that projects an image on a screen. The projection display 200 is coupled to an external image supplying apparatus such as a computer including PC or the like or a variety of image players through I/F (interface). The projection display 200 makes a projection on the screen or the like on the basis of an image signal that is inputted to this I/F. It is to be noted that a configuration of the projection display 200 described below is an example. The projection display according to the present technology is not limited to such a configuration.

The projection display 200 includes the light emitting apparatuses 1 and 2, a multi-lens array 212, a PBS array 213, a focus lens 214, mirrors 215a and 215c to 215e, dichroic mirrors 216 and 217, light modulators 218a to 218c, a dichroic prism 219, and a projection lens 220.

In each of the light emitting apparatuses 1 and 2, the light emitted from the light emitting element 11 passes through the array lens 33 and is extracted as collimated light. This light enters the multi-lens array 212. The multi-lens array 212 has a structure in which a plurality of lens elements is provided in an array. The multi-lens array 212 condenses the light emitted from each of the light emitting apparatuses 1 and 2. The PBS array 213 polarizes the light condensed by the multi-lens array 212 as light having a predetermined polarization direction, for example, a P-polarized wave. The focus lens 214 condenses the light that has been converted by the PBS array 213 into the light having a predetermined polarization direction.

The dichroic mirror 216 transmits red light R and reflects green light G and blue light B of the pieces of light that have entered the dichroic mirror 216 through the focus lens 214 and the mirror 215e. The red light R transmitted by the dichroic mirror 216 is guided to the light modulator 218a through the mirror 215a.

The dichroic mirror 217 transmits the blue light B and reflects the green light G of the pieces of light reflected by the dichroic mirror 216. The green light G reflected by the dichroic mirror 217 is guided to the light modulator 218b. In contrast, the blue light B transmitted by the dichroic mirror 217 is guided to the light modulator 218c through the mirror 215d and the mirror 215c.

The light modulators 218a to 218c optically modulate the respective pieces of incident color light and input the respective pieces of optically modulated color light to the dichroic prism 219. The dichroic prism 219 combines the respective pieces of color light that have been optically modulated and entered the dichroic prism 219 into one optical axis. The respective pieces of combined color light are projected onto a screen or the like through the projection lens 220.

In the projection display 200, the three light modulators 218a to 218c corresponding to the three primary colors of red, green, and blue are combined and display any color. In other words, the projection display 200 is a so-called three-plate projection display.

The present technology has been described with reference to the first and second embodiments, the modification examples 1 to 14, and the application example, but the present technology is not limited to the embodiments or the like described above. A variety of modifications are possible. For example, the wiring structure provided in the housing member 14 described in the first embodiment described above is an example. For example, the electrode extraction sections 14E1 and 14E2 provided on the surface of the housing member 14 may be provided on the upper surface 15S1 of the cover 15. Alternatively, the electrode extraction sections 14E1 and 14E2 may be provided on the back surface 14S2 of the housing member 14.

In addition, the first embodiment or the like described above describes the example in which the solder bonding section 16 is used as an electrical conduction path between the cathode of the light emitting element 11 and the electrode extraction section 14E1, but this is not limitative. For example, the solder bonding section 16 may also be used as an electrical conduction path between the anode of the light emitting element 11 and the electrode extraction section 14E2. Further, the first embodiment or the like described above describes the example in which the one light emitting element 11 is housed in the recessed section 14C, but the two or more light emitting elements 11 may be housed. More-over, the light emitting elements 11 corresponding to wavelengths different from each other may be housed.

Further, the first embodiment or the like described above describes the example in which the light emitted from the light emitting element 11 is extracted from the upper cover 15, but the light may be extracted, for example, from the side surface of the housing member 14, i.e., the horizontal direction. This allows a metal plate or the like to be used as the cover 15.

In addition, the components, the disposition, the number, and the like of the light emitting apparatuses 1 and 2 exemplified in the first embodiment or the like described above are merely examples. Each of the light emitting apparatuses 1 and 2 does not have to include all the components. In addition, each of the light emitting apparatuses 1 and 2 may further include another component.

For example, the above-described light emitting apparatuses 1 and 2 provided with the terminal sections 322E and 313E in the lens holding member 32 or the base plate 31 have been described. Each of the terminal sections 322E and 313E is for electrically coupling the light emitting element 11 and the outside. There may be, however, provided terminal sections separately from the lens holding member 32 and the base plate 31.

It is to be noted that the effects described in this specification are mere examples, but not limited thereto. In addition, there may be other effects.

It is to be noted that the present technology may also have configurations as follows. In the first semiconductor device according to the present technology having the following configurations, on at least one of the bonded surface of the first housing member or the bonded surface of the second housing member, the solder adsorption layer is provided at the position apart from the corresponding base layer. This makes it possible to prevent solder dripping inside the housing space in which the semiconductor element is housed. In addition, in the second semiconductor device according to the present technology having the following configurations, on at least one of the first base layer or the second base layer, the solder diffusion prevention layer having different wettability from the corresponding base layer is provided. This makes it possible to prevent solder dripping inside the housing space in which the semiconductor element is housed and to the outer side of the housing member. It is thus possible to reduce occurrence of a short circuit due to drop-off of solder or the like. In other words, it is possible to improve reliability.

(1)
A semiconductor device including:
a semiconductor element;
a first housing member and a second housing member that house the semiconductor element;
a first base layer formed on a bonded surface of the first housing member to the second housing member;
a second base layer formed on a bonded surface of the second housing member to the first housing member;
a solder bonding section that bonds the first housing member and the second housing member with the first base layer and the second base layer interposed in between; and
a solder adsorption layer provided on at least one of the bonded surface of the first housing member or the bonded surface of the second housing member to be apart from the first base layer and the second base layer.

(2)
The semiconductor device according to (1), in which
the second housing member forms a housing space that houses the semiconductor element, along with the first housing member, by covering a recessed section provided on the first housing member and housing the semiconductor element, and
the solder adsorption layer is provided on the bonded surface of the second housing member.

(3)
The semiconductor device according to (1) or (2), in which
the first housing member includes a recessed section forming a housing space that houses the semiconductor element, and
the solder adsorption layer is provided on the bonded surface of the first housing member.

(4)
The semiconductor device according to any one of (1) to (3), in which the solder adsorption layer is formed on the second housing member, on an inner side with respect to the second base layer.

(5)
The semiconductor device according to any one of (1) to (4), in which the solder adsorption layer is formed on the second housing member, on an outer side with respect to the second base layer.

(6)
The semiconductor device according to any one of (1) to (5), in which the solder adsorption layer is formed on the first housing member, on an inner side with respect to the first base layer.

(7)
The semiconductor device according to any one of (1) to (6), in which the solder adsorption layer is formed on the first housing member, on an outer side with respect to the first base layer.

(8)
The semiconductor device according to any one of (1) to (7), in which the solder adsorption layer is provided in a frame shape.

(9)
The semiconductor device according to (8), in which
the first housing member and the second housing member each have a polygonal shape, and
the solder adsorption layer includes a widened section at a corner.

(10)
The semiconductor device according to any one of (1) to (7), in which the solder adsorption layer is formed in a plurality of island-shaped patterns.

(11)
The semiconductor device according to (10), in which
the first housing member and the second housing member each have a polygonal shape, and
the solder adsorption layer includes a larger pattern at a corner than on a side.

(12)
The semiconductor device according to any one of (1) to (11), in which a distance between the solder adsorption layer, and the first base layer or the second base layer formed on a same surface as the solder adsorption layer is equal to or more than 10 µm and equal to or less than a width of the first base layer or the second base layer formed on the same surface as the solder adsorption layer.

(13)
The semiconductor device according to any one of (1) to (12), in which
the first housing member and the second housing member form a housing space that houses the semiconductor element, and
the semiconductor element is hermetically sealed in the housing space.

(14)
The semiconductor device according to any one of (1) to (13), in which
the semiconductor element includes a light emitting element, and
the solder adsorption layer is formed except in a transmissive region for light emitted from the light emitting element.

(15)
The semiconductor device according to (14), in which the light emitting element emits the light in a wavelength band of 470 nm or less.

(16)
The semiconductor device according to (14) or (15), in which the light emitting element includes a semiconductor laser.

(17)
A semiconductor device including:
a semiconductor element;
a first housing member and a second housing member that house the semiconductor element;
a first base layer formed on a bonded surface of the first housing member to the second housing member;
a second base layer formed on a bonded surface of the second housing member to the first housing member;
a solder bonding section that bonds the first housing member and the second housing member with the first base layer and the second base layer interposed in between; and
a solder diffusion prevention layer provided on at least one of the first base layer or the second base layer and having different wettability from the first base layer and the second base layer.

(18)
The semiconductor device according to (17), in which the solder diffusion prevention layer is formed on an inner side with respect to the solder bonding section.

(19)
The semiconductor device according to (17) or (18), in which the solder diffusion prevention layer is formed on an outer side with respect to the solder bonding section.

(20)
The semiconductor device according to any one of (17) to (19), in which the solder diffusion prevention layer includes a dielectric material.

This application claims the priority on the basis of Japanese Patent Application No. 2019-195148 filed with Japan Patent Office on Oct. 28, 2019, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A semiconductor device comprising:
a semiconductor element;
a first housing member and a second housing member that house the semiconductor element;
a first base layer formed on a first bonded surface of the first housing member to the second housing member;
a second base layer formed on a second bonded surface of the second housing member to the first housing member, the first bonded surface facing the second bonded surface, and the first bonded surface and the second bonded surface are spaced away from each other in a first direction;
a solder bonding section that bonds the first housing member and the second housing member with the first base layer and the second base layer interposed in between; and
a solder adsorption layer
provided between the first bonded surface and the second bonded surface in the first direction and on at least one of the first bonded surface or the second bonded surface,
spaced apart from the first base layer and the second base layer in a second direction that intersects the first direction, and
unopposed by the first base layer, the second base layer, and any other base layer in the first direction.

2. The semiconductor device according to claim 1, wherein
the second housing member forms a housing space that houses the semiconductor element, along with the first housing member, by covering a recessed section provided on the first housing member and housing the semiconductor element, and
the solder adsorption layer is provided on the bonded surface of the second housing member.

3. The semiconductor device according to claim 1, wherein
the first housing member includes a recessed section forming a housing space that houses the semiconductor element, and
the solder adsorption layer is provided on the bonded surface of the first housing member.

4. The semiconductor device according to claim 1, wherein the solder adsorption layer is formed on the second housing member, on an inner side with respect to the second base layer.

5. The semiconductor device according to claim 1, wherein the solder adsorption layer is formed on the second housing member, on an outer side with respect to the second base layer.

6. The semiconductor device according to claim 1, wherein the solder adsorption layer is formed on the first housing member, on an inner side with respect to the first base layer.

7. The semiconductor device according to claim 1, wherein the solder adsorption layer is formed on the first housing member, on an outer side with respect to the first base layer.

8. The semiconductor device according to claim 1, wherein the solder adsorption layer is provided in a frame shape.

9. The semiconductor device according to claim 8, wherein
the first housing member and the second housing member each have a polygonal shape, and
the solder adsorption layer includes a widened section at a corner.

10. The semiconductor device according to claim 1, wherein the solder adsorption layer is formed in a plurality of island-shaped patterns.

11. The semiconductor device according to claim 10, wherein
the first housing member and the second housing member each have a polygonal shape, and
the solder adsorption layer includes a larger pattern at a corner than on a side.

12. The semiconductor device according to claim 1, wherein a distance between the solder adsorption layer, and the first base layer or the second base layer formed on a same surface as the solder adsorption layer is equal to or more than 10 μm and equal to or less than a width of the first base layer or the second base layer formed on the same surface as the solder adsorption layer.

13. The semiconductor device according to claim 1, wherein
the first housing member and the second housing member form a housing space that houses the semiconductor element, and
the semiconductor element is hermetically sealed in the housing space.

14. The semiconductor device according to claim 1, wherein
the semiconductor element comprises a light emitting element, and
the solder adsorption layer is formed except in a transmissive region for light emitted from the light emitting element.

15. The semiconductor device according to claim 14, wherein the light emitting element emits the light in a wavelength band of 470 nm or less.

16. The semiconductor device according to claim 14, wherein the light emitting element includes a semiconductor laser.

* * * * *